US012794478B1

(12) United States Patent
Earley et al.

(10) Patent No.: US 12,794,478 B1
(45) Date of Patent: Nov. 10, 2026

(54) MULTIPLEXED CLOCK SYSTEM AND METHOD OF OPERATION

(71) Applicant: Vaire Computing Ltd, London (GB)

(72) Inventors: Amelie Hannah Earley, London (GB); Emy Tan, London (GB); Simon Chang, London (GB)

(73) Assignee: Vaire Computing Ltd, London (GB)

( * ) Notice: Subject to any disclaimer, the term of this patent is extended or adjusted under 35 U.S.C. 154(b) by 0 days.

(21) Appl. No.: 19/232,201

(22) Filed: Jun. 9, 2025

Related U.S. Application Data

(60) Provisional application No. 63/672,445, filed on Jul. 17, 2024, provisional application No. 63/657,324, filed on Jun. 7, 2024.

(51) Int. Cl.

*H03K 19/173* (2006.01)
*G06F 1/06* (2006.01)
*H03K 19/20* (2006.01)

(52) U.S. Cl.

CPC ........... *H03K 19/1737* (2013.01); *G06F 1/06* (2013.01); *H03K 19/20* (2013.01)

(58) Field of Classification Search

CPC ....... H03K 19/1737; H03K 19/20; G06F 1/06
See application file for complete search history.

(56) References Cited

U.S. PATENT DOCUMENTS

| | | | | |
|---|---|---|---|---|
| 7,616,073 | B1 * | 11/2009 | Taheri | H03B 5/326 331/155 |
| 7,941,723 | B1 * | 5/2011 | Lien | H03B 5/32 714/744 |
| 11,108,383 | B1 * | 8/2021 | Moser | G11C 19/28 |
| 2017/0194908 | A1 * | 7/2017 | Madala | H03B 5/1212 |
| 2018/0239307 | A1 * | 8/2018 | Tsutsumi | G04F 10/005 |
| 2022/0231694 | A1 * | 7/2022 | Kurihara | H03K 3/03 |
| 2022/0239255 | A1 * | 7/2022 | Pamarti | H03L 3/00 |
| 2022/0393688 | A1 * | 12/2022 | Kundu | H03L 7/12 |
| 2023/0196960 | A1 * | 6/2023 | Mondal | G06F 1/06 345/204 |
| 2025/0123650 | A1 * | 4/2025 | Kamath | G06F 1/08 |

(Continued)

FOREIGN PATENT DOCUMENTS

| | | | | | |
|---|---|---|---|---|---|
| EP | 0268409 | A2 * | 5/1988 | G06F 1/10 |
| WO | WO-2023250007 | A1 * | 12/2023 | H03K 3/037 |
| WO | WO-2025165925 | A1 * | 8/2025 | H03K 19/0019 |

OTHER PUBLICATIONS

Athas, et al., "An Energy-Efficient CMOS Line Driver Using Adiabatic Switching", Proceedings of 4th Great Lakes Symposium on VLSI, Notre Dame, IN, USA, Mar. 4-5, 1994, 10.1109/GLSV.1994.289970, (1994).

(Continued)

*Primary Examiner* — Seokjin Kim
(74) *Attorney, Agent, or Firm* — Jeffrey Schox; Samuel Rosenthal

(57) ABSTRACT

A multiplexed clock system, preferably including a reference clock, a controller, and one or more multiplexer cells. The multiplexed clock system preferably functions to generate a plurality of clock signals, such as for use in a reversible computing system. A method of operation for a multiplexed clock system, preferably including generating a plurality of clock signals and/or providing one or more clock signals to a computing system.

20 Claims, 18 Drawing Sheets

(56) References Cited

U.S. PATENT DOCUMENTS

2026/0012161 A1* 1/2026 Snider .................... H03K 3/037

OTHER PUBLICATIONS

Earley, et al., "Multiplexed Clock System and Method of Operation", Co-pending U.S. Appl. No. 19/371,650, filed Oct. 28, 2025.
Frank, Michealp. , "Physical Limits of Computing", Slides for a course taught by Dr. Michael P. Frank in the Department of Electrical & Computer Engineering, Florida State University, EEL 4930 (§6) & 5930 (§5), Spring 2006.
Frank, et al., "Special Session: Exploring the Ultimate Limits of Adiabatic Circuits", Conference: Special Session: Exploring the Ultimate Limits of Adiabatic Circuits, https://doi.org/10.2172/1825605, Oct. 1, 2020.
Debenedictis, Erikp. , "Quiet 2-Level Adiabatic Logic", Zettaflops, LLC Technical Report ZF009, Apr. 9, 2021.
Frank, et al., "Reversible Computing with Fast, Fully Static, Fully Adiabatic CMOS", Manuscript submitted to ICRC 2020, Sep. 2, 2020, arXiv:2009.00448 [cs.AR].

* cited by examiner

MULTIPLEXED CLOCK SYSTEM AND METHOD OF OPERATION

CROSS-REFERENCE TO RELATED APPLICATIONS

This application claims the benefit of U.S. Provisional Application No. 63/657,324, filed 7 Jun. 2024, and U.S. Provisional Application No. 63/672,445, filed 17 Jul. 2024, each of which is herein incorporated in its entirety by this reference.

TECHNICAL FIELD

This invention relates generally to the computing field, and more specifically to a new and useful multiplexed clock system and method of operation.

DETAILED DESCRIPTION OF THE INVENTION

The following description of the preferred embodiments of the invention is not intended to limit the invention to these preferred embodiments, but rather to enable any person skilled in the art to make and use this invention.

1. Overview.

Figure 1:
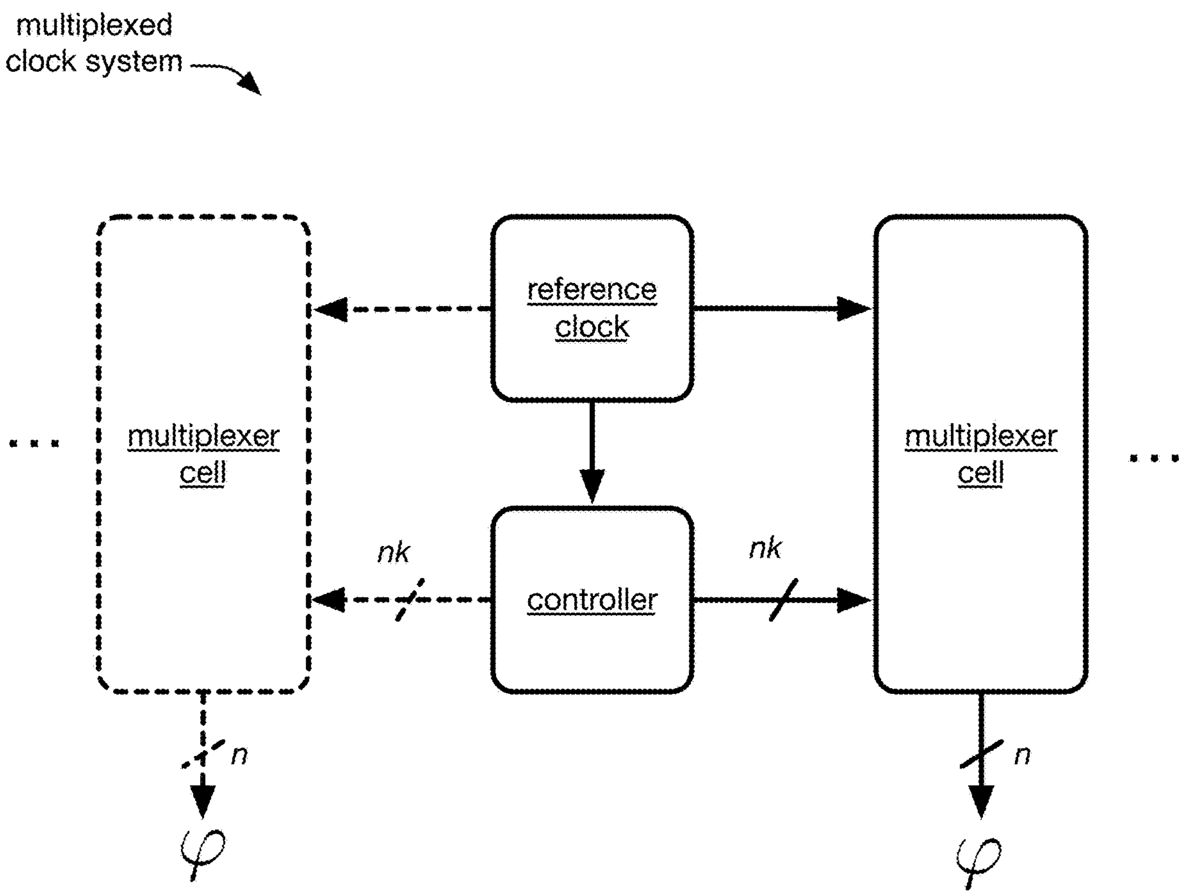
FIG. 1 is a schematic representation of an embodiment of a multiplexed clock system.

A multiplexed clock system preferably functions to generate a plurality of clock signals (e.g., trapezoidal and/or quasi-trapezoidal clock signals) such as for use in a reversible computing system. The multiplexed clock system preferably includes a reference clock, a controller, and one or more multiplexer cells (e.g., as shown in FIG. 1). However, the multiplexed clock system can additionally or alternatively include any other suitable elements.

Figure 2:
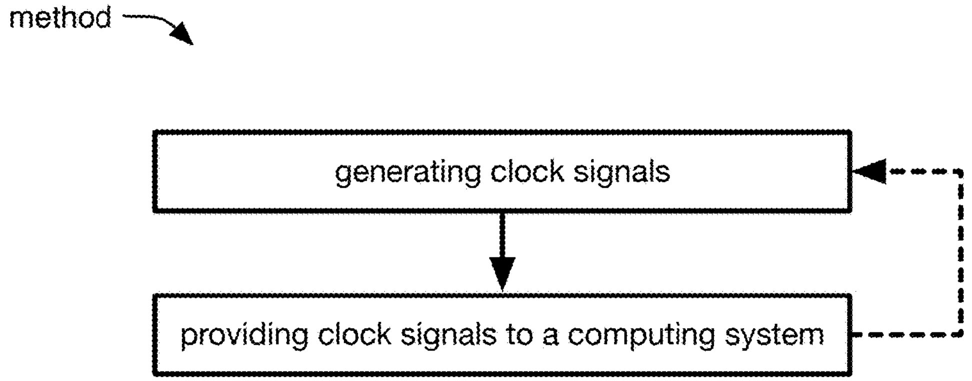
FIG. 2 is a schematic representation of an embodiment of a method of use.

A method of operation for a multiplexed clock system preferably includes generating a plurality of clock signals and/or providing one or more clock signals to a computing system (e.g., reversible computing system), such as shown by way of example in FIG. 2. However, the method can additionally or alternatively include any other suitable elements.

The multiplexed clock system is preferably configured to perform the method of operation, but can additionally or alternatively have any other suitable functionality. The method of operation is preferably performed using the multiplexed clock system described herein, but can additionally or alternatively be performed using any other suitable system(s).

In a first variation, the system and/or method can generate phased clock signals (e.g., trapezoidal or quasi-trapezoidal clock signals), wherein the clock signals preferably all use the same (or substantially the same) clock waveform, translated in time relative to the other clock signals (e.g., wherein each clock signal is delayed one tick relative to the previous clock signal, as described by the relation $\varphi_i(t)=\varphi_{i+k}(\tau+k)$). For a system and/or method configured to generate a total of n phased clock signals, these clock signals can be denoted as $\varphi_i$, wherein i is an integer between zero and n−1, and wherein the clock signals are preferably periodic with a period of n ticks. A person of skill in the art will recognize that, for the phased clock signals $\varphi_i$, values of i can be evaluated modulo n (or, for clock waveforms having a periodicity other than n ticks, modulo the number of ticks in the waveform period), such as wherein $\varphi_{i+n}$ is understood to be equivalent to $\varphi_i$.

In some examples of this variation, the duty cycle of such clock signals is 50% (or is approximately 50%, such as being within the range 49.5-50.5%, 49-51%, 48-52%, 45-55%, and/or 40-60%, etc.), such as shown by way of examples in FIGS. 3A-3E. In other examples, the duty cycle may be greater than 50% (e.g., 55%, 60%, 65%, 70%, 75%, 80%, 85%, 90%, 95%, greater than 50% but less than 60%, 60-70%, 70-80%, 80-90%, 90-95%, and/or greater than 95%, etc.), such as shown by way of example in FIG. 3F. In other examples, the duty cycle may be less than 50% (e.g., 5%, 10%, 15%, 20%, 25%, 30%, 35%, 40%, 45%, less than 5%, 5-10%, 10-20%, 20-30%, 30-40%, greater than 40% but less than 50%, etc.).

Figure 3A:
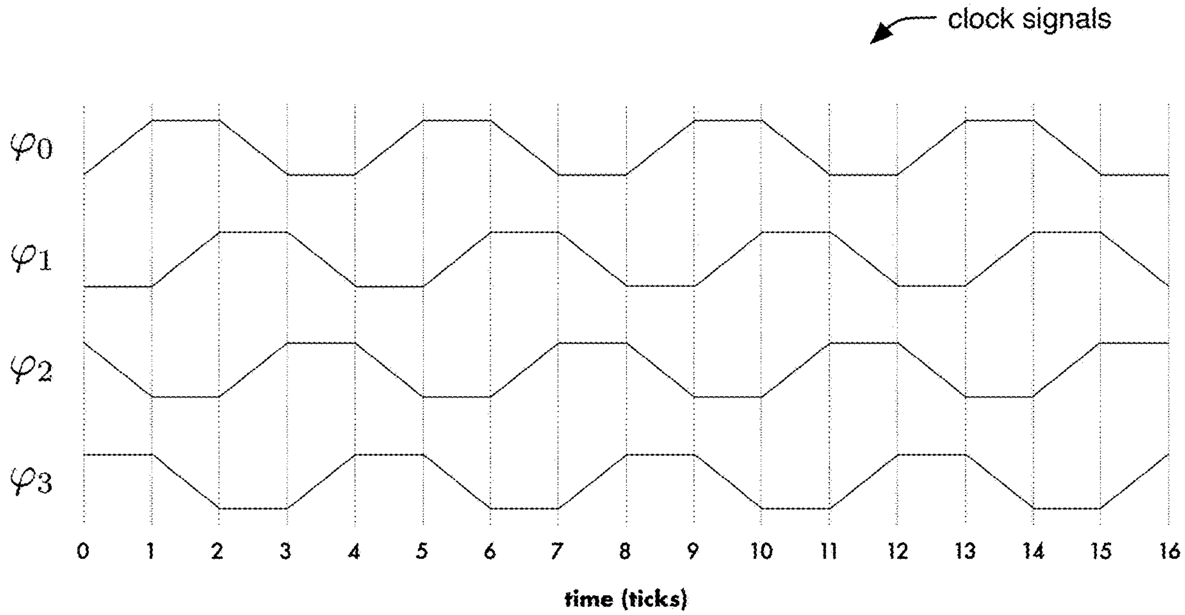
FIGS. 3A-3F are schematic representations of various examples of clock signals.
Figure 3B:
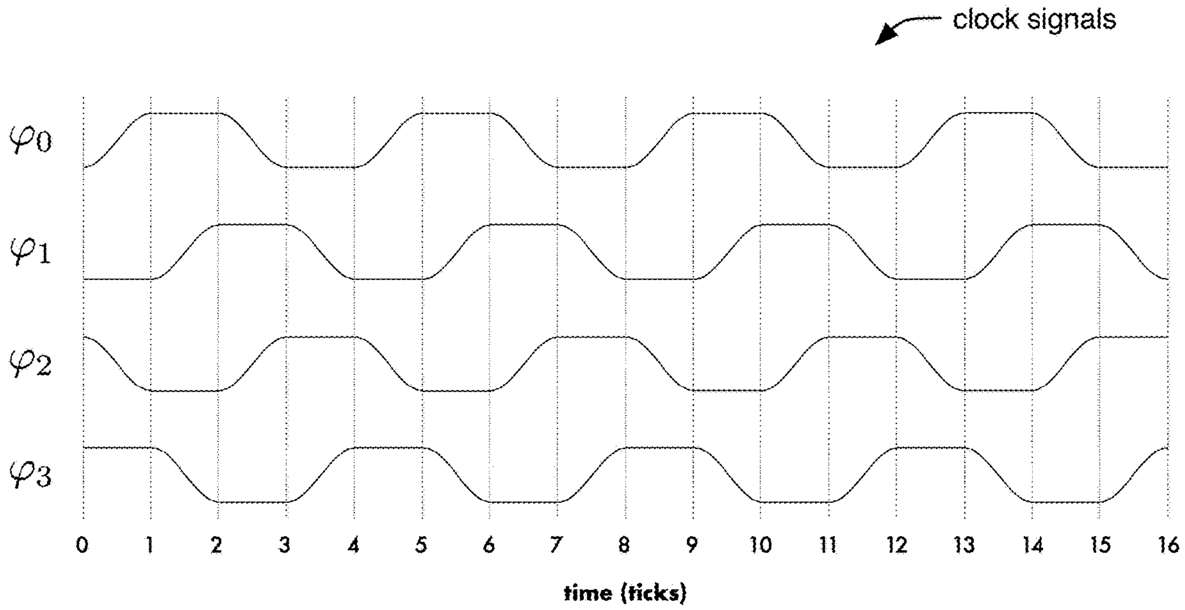
Figure 3C:
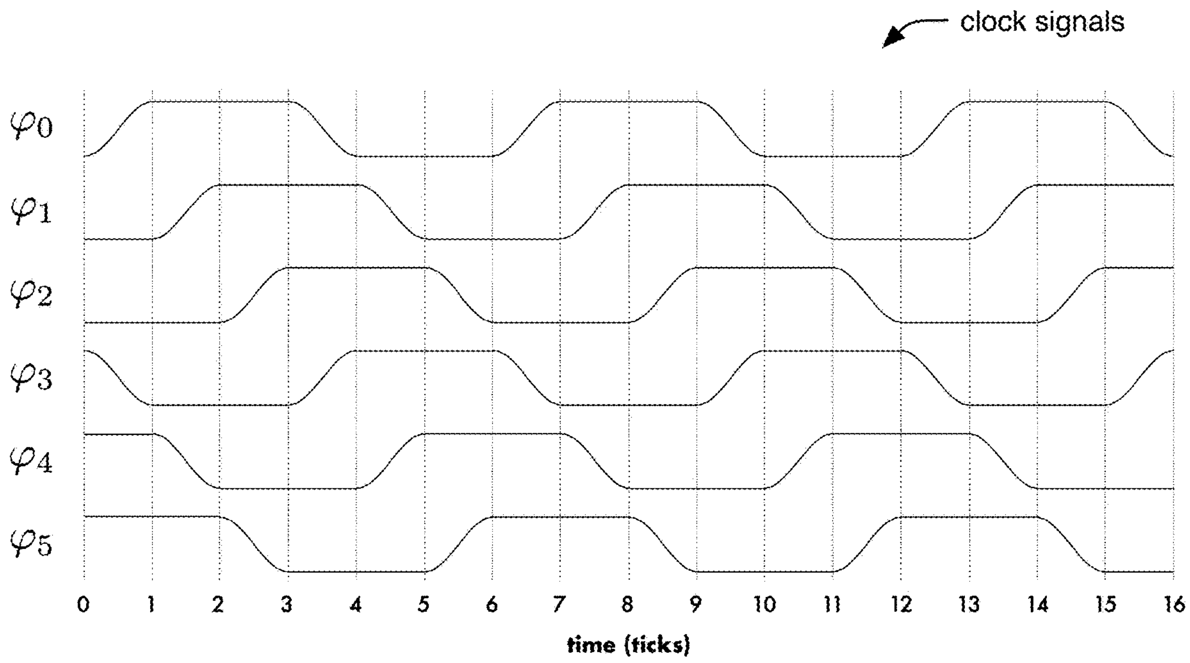
Figure 3D:
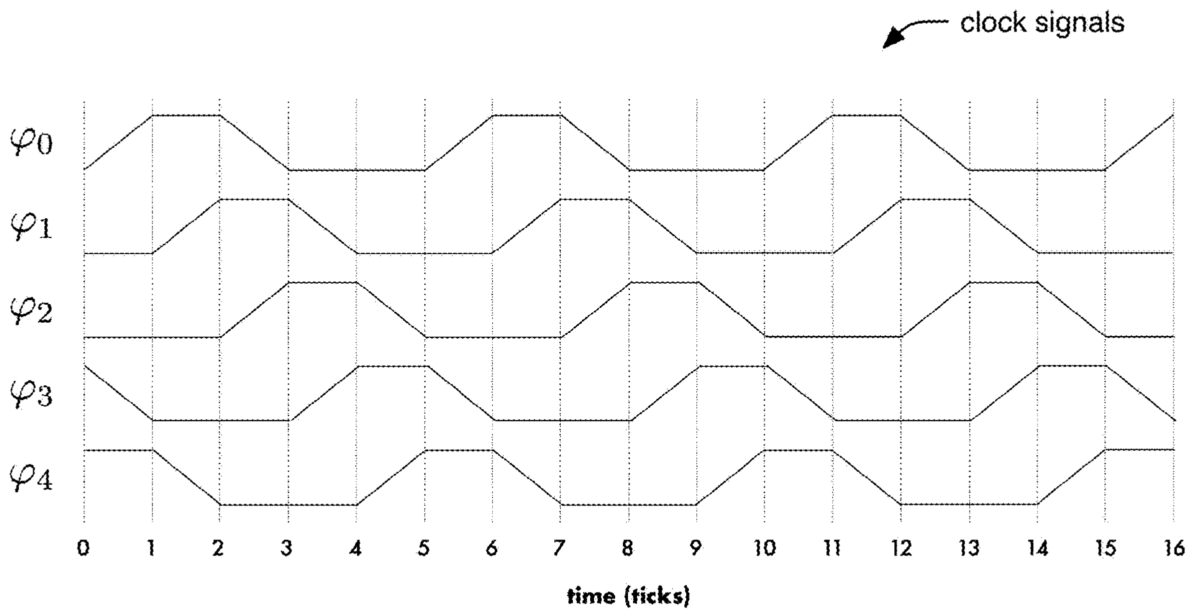
Figure 3E:
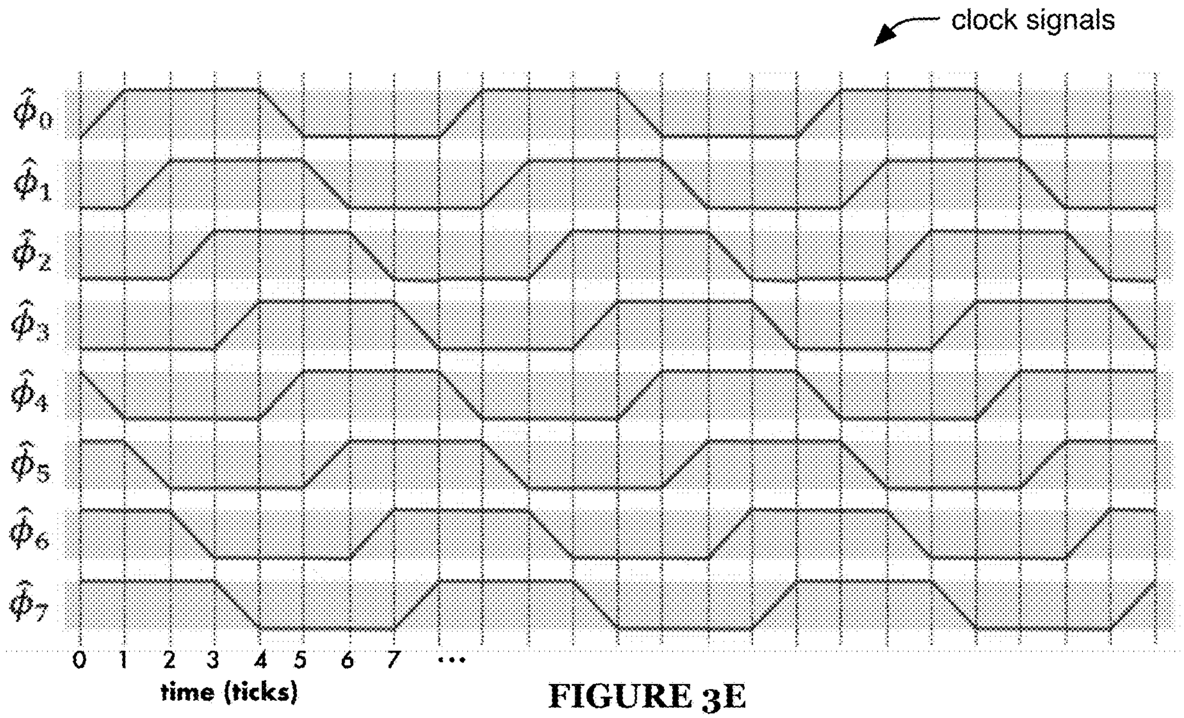
Figure 3F:
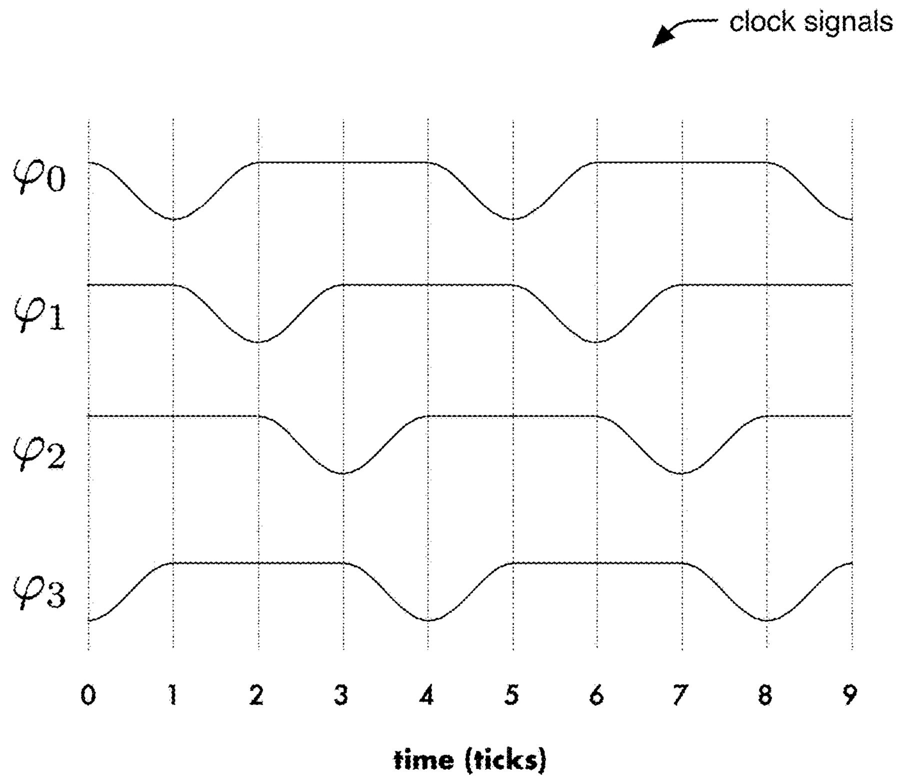

In a first example of this variation, the clock signals can be 4-phase trapezoidal clock signals (e.g., as shown in FIG. 3A) or quasi-trapezoidal clock signals (e.g., as shown in FIG. 3B), preferably wherein the clock signals are periodic with a period of four ticks. In a second example of this variation, the clock signals can be 6-phase trapezoidal or quasi-trapezoidal clock signals (e.g., as shown in FIG. 3C), preferably wherein the clock signals are periodic with a period of 6 ticks. In a third example of this variation, the clock signals can be 5-phase trapezoidal or quasi-trapezoidal clock signals (e.g., as shown in FIG. 3D), preferably wherein the clock signals are periodic with a period of 5 ticks. In a fourth example of this variation, the clock signals can be 8-phase trapezoidal or quasi-trapezoidal clock signals (e.g., as shown in FIG. 3E), preferably wherein the clock signals are periodic with a period of 8 ticks. In a fifth example of this variation, the clock signals can be 12-phase trapezoidal or quasi-trapezoidal clock signals, preferably wherein the clock signals are periodic with a period of 12 ticks. In a sixth example of this variation, the clock signals can be 16-phase trapezoidal or quasi-trapezoidal clock signals, preferably wherein the clock signals are periodic with a period of 16 ticks. Although many of the examples depicted exhibit symmetry within each period, a person of skill in the art will recognize that no such symmetry is required, and that the system and/or method can additionally or alternatively include generating any suitable periodic waveforms (e.g., any periodic waveforms that are made only of, or substantially only of, the four constituent one-tick segments described herein, being a constant low tick, a constant high tick, a rising tick from low to high, and a falling tick from high to low, with no or substantially no discontinuities in the waveform). In additional examples, the clock signals can be trapezoidal or quasi-trapezoidal periodic clock signals (e.g., with 50% or approximately 50% duty cycle, with greater than 50% duty cycle, with less than 50% duty cycle, etc.) with a period of 3, 7, 9, 10, 11, 13, 14, 15, 17, 18, 19, 20, 21, 22, 23, 24, 25, 26, 27, 28, 29, 30, or greater than 30 ticks. However, the system and/or method can additionally or alternatively generate any other suitable phased clock signals.

Figure 4:
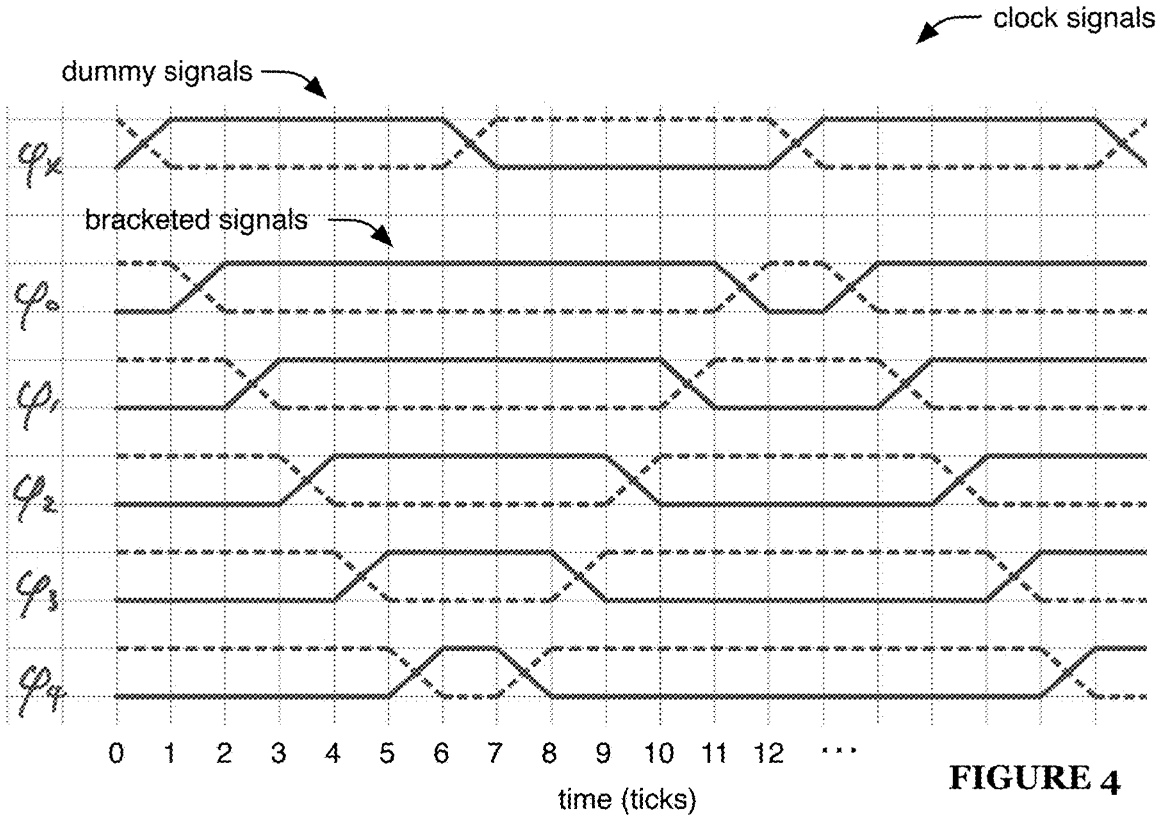
FIG. 4 is a schematic representation of an example of clock signals.

In a second variation, the system and/or method can generate Bennett clock signals (e.g., as shown in FIG. 4). Here, each bracketed waveform $\varphi_i$ is preferably generated along with an inverse waveform $\overline{\varphi}_i$ coupled to a substantially equal capacitive load. Further, a pair (positive and inverse) of 'dummy' waveforms $\varphi_x$ are preferably generated and coupled to a substantially equal capacitive load as each bracketed waveform, wherein these dummy waveforms each include a ramp during each tick in which all of the bracketed waveforms are held constant. In the specific example depicted in FIG. 4 (which includes five bracketed waveforms and one dummy waveform, along with their inverses, all having a periodicity of 12 ticks), all of the bracketed waveforms are held constant in the interval between ticks 0 and 1, and again in the interval between ticks 6 and 7. In examples, the Bennett clock signals can include 1, 2, 3, 4, 5, 6, 7, 8, 9, 10, 11, 12, 13, 14, 15, 16, 24, 32, 64, 1-4, 5-9, 10-15, 16-20, 21-30, 31-40, 41-50, 51-60, 61-80, or more than 80 bracketed waveforms and one dummy waveform, preferably along with their inverses, all having the same periodicity (e.g., for n bracketed clock signals, a periodicity of 2n+2 ticks).

In some examples of this variation, the system and/or method can generate multiple sets of Bennett clock signals (e.g., wherein each such set includes a plurality of bracketed waveforms, and can optionally include a dummy waveform, all preferably along with their inverses), such as wherein the multiple sets are offset in timing from each other but are otherwise identical. In a first example, the different clock signals of these multiple sets of Bennett clock signals can define periodic phased clock signals (e.g., as described above regarding the first variation), such as wherein the number of (identical but for a phase offset) sets of Bennett clock signals is equal to the period length (in ticks) of each Bennett clock signal (e.g., wherein each set of Bennett clock signals is offset in phase by 1 tick from the set that precedes it). In this first example, the sets of Bennett clock signals may omit the dummy waveforms, as, across all sets of Bennett clock signals, the number of rising waveforms (and identically, the number of falling waveforms) is constant between all ticks, due to the staggering of the different sets of clock signals across all possible integer-tick phase offsets, and so there is no need for dummy waveforms; analogously, in any other suitable examples in which the number of rising waveforms is constant and the number of falling waveforms is constant, the dummy waveforms may be omitted.

However, the system and/or method can additionally or alternatively generate any other suitable clock signals.

2. Multiplexed Clock System.

2.1 Reference Clock.

The reference clock preferably functions to provide a square wave control signal (e.g., to the multiplexer cells, such as to the resonators thereof). In examples, the reference clock can include a phase-locked loop (PLL), an external clock reference, and/or any other suitable elements.

In some variations, the resonator of one or more multiplexer cells can optionally be used as part of the reference clock (e.g., used both as a resonator for the multiplexer cell and for the PLL).

However, the reference clock can additionally or alternatively include any other suitable elements.

2.2 Controller.

Figure 5A:
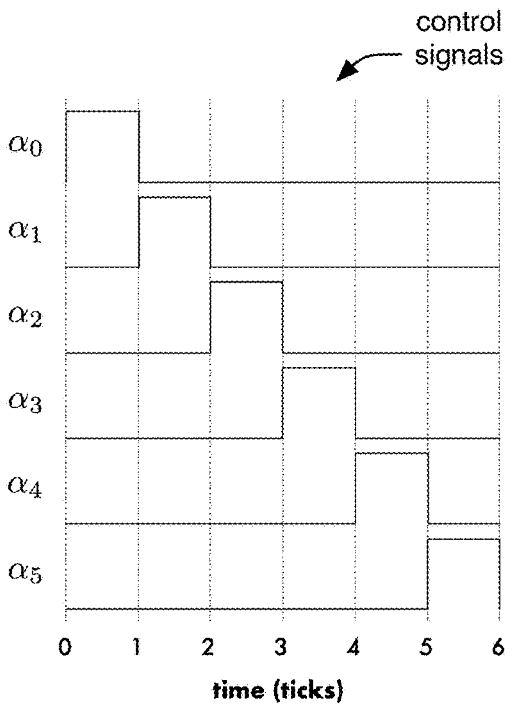
FIGS. 5A-5B are schematic representations of a first and second example, respectively, of control signals.
Figure 5B:
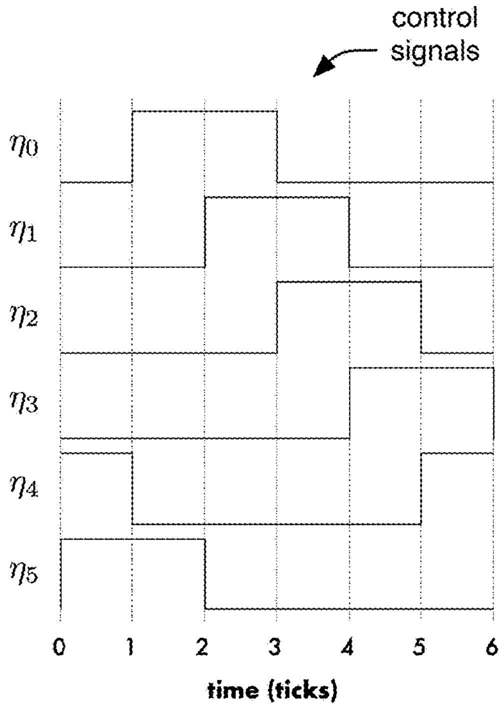

The controller preferably functions to control operation of the multiplexer cells, such as by providing a set of multiplexer control signals to the multiplexer cells. The multiplexer control signals preferably include a set of a signals (e.g., as shown in FIG. 5A), more preferably equal in number to the number of clock signals to be generated, wherein the $\alpha$ signals control the timing of some or all voltage ramps in the generated clock signals. Additionally or alternatively, the multiplexer control signals can optionally include a set of $\eta$ signals (e.g., as shown in FIG. 5B), preferably equal in number to the number clock signals to be generated and/or the number of a signals, wherein the n signals can control the timing of some or all flat regions in the generated clock signals. However, the multiplexer control signals can additionally or alternatively include any other suitable signals generated in any suitable manner.

The controller preferably includes a counter and one or more combinational logic networks. However, the controller can additionally or alternatively include any other suitable elements.

The system preferably includes a single controller. However, in some examples, the system can optionally include multiple controllers (e.g., wherein each controller controls a different set of one or more multiplexer cells, preferably wherein the sets are disjoint).

Figure 6A:
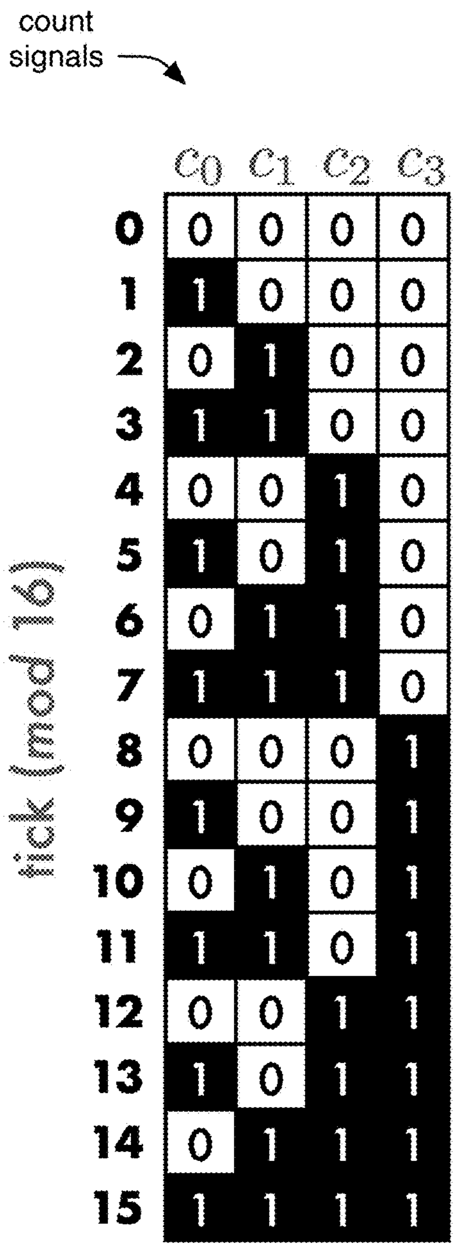
FIGS. 6A-6D are schematic representations of various examples of count signals.
Figure 6B:
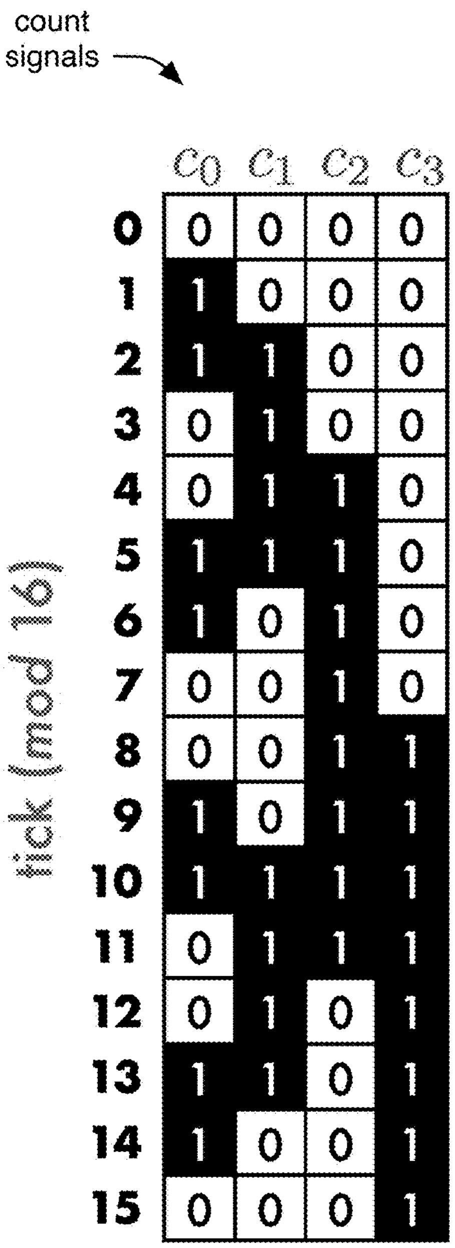
Figure 6C:
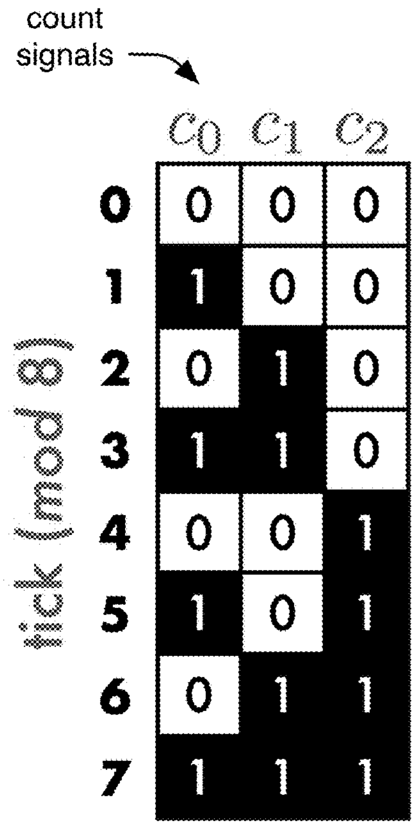
Figure 6D:
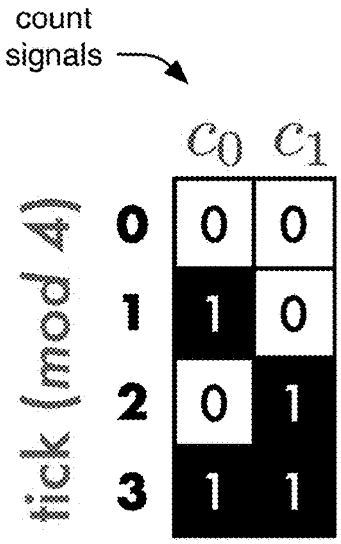
Figure 7:
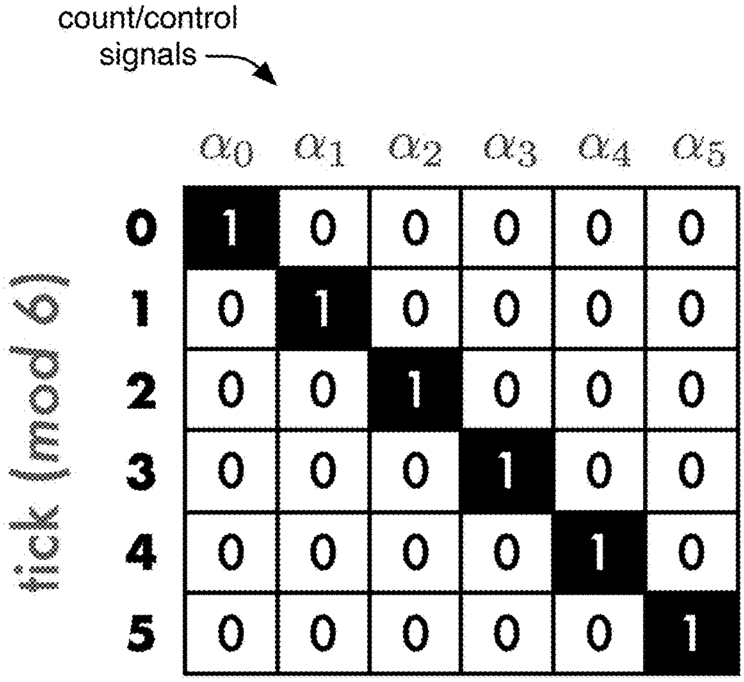
FIG. 7 is a schematic representation of an example of count signals.

The counter preferably counts ticks modulo n, where n is the number of distinct clock signals to be generated by the system. In examples, the counter can count from 0-3 for a system that generates four clock signals, can count from 0-5 for a system that generates six clock signals, can count from 0-7 for a system that generates eight clock signals, can count from 0-15 for a system that generates 16 clock signals, and so on. The counter can output the count as a binary signal (e.g., as shown by way of examples in FIGS. 6A-6D), a one-hot signal (e.g., as shown in FIG. 7), a unary signal, and/or any other suitable signal.

Figure 8:
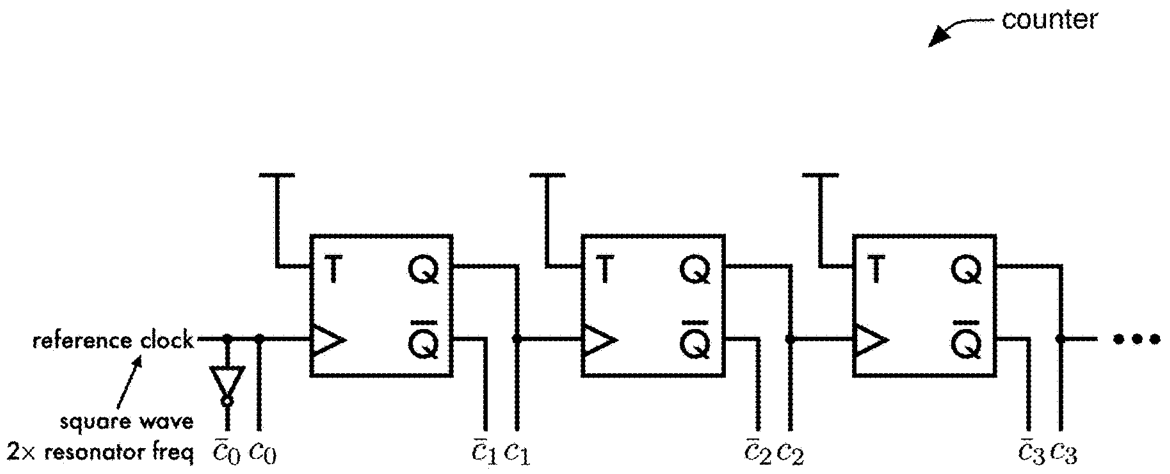
FIGS. 8-9 are schematic representations of a first and second example, respectively, of counters.

In a first embodiment (e.g., in which n is a power of two, where $n=2^b$ for a non-negative integer b), the counter preferably outputs a binary signal. The binary signal can use a standard binary encoding (e.g., as shown in FIGS. 6A and/or 6C), can be represented by Gray codes (e.g., as shown in FIG. 6B), and/or can have any other suitable representation. In one example, the counter includes a series of T-type flip-flops, wherein each such flip-flop includes a T (toggle) input terminal, a CLK (clock) input terminal, a Q (normal) output terminal, and a $\overline{Q}$ (complementary) output terminal. In a specific example, the counter can include a series of b−1 flip-flops (e.g., as shown in FIG. 8), indexed from 1 to b. In this specific example, each T input is preferably connected to the high rail; each Q output preferably serves as the normal output for the counter bit corresponding to the flip-flop's index (e.g., wherein flip-flop 1 outputs bit 1, flip-flop 2 outputs bit 2, etc.) and (except for the final flip-flop) is preferably connected to the clock input of the subsequent flip-flop (e.g., wherein the reference clock input acts in place of a zeroth flip-flop, serving as both bit 0 of the normal output and as the input to flip-flop 1's CLK input, wherein bit 0 of the complementary output can be generated by passing the reference clock input through an inverter); and each Q output preferably serves as the complementary output for the counter bit corresponding to the flip-flop's index.

Figure 9:
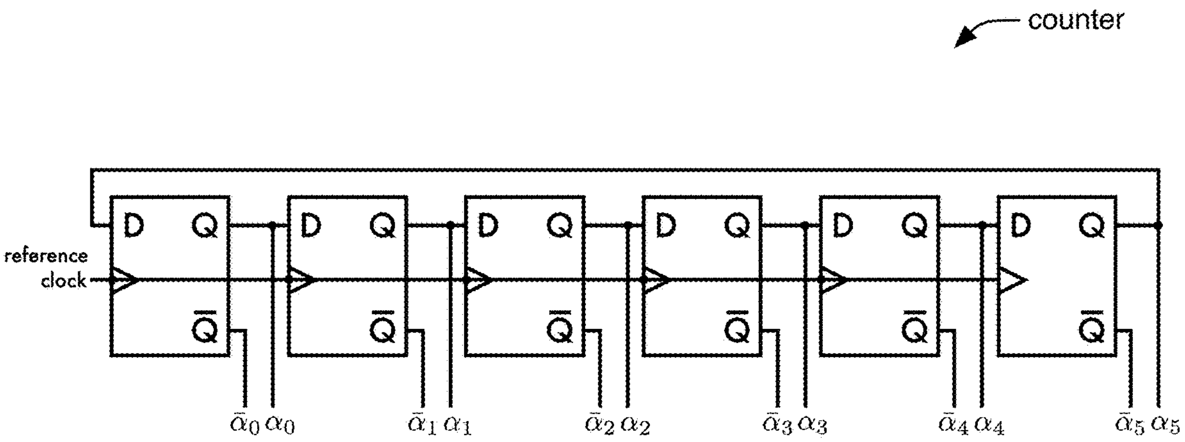

In a second embodiment (e.g., where n is not a power of two), the counter preferably outputs a one-hot signal. In one example of this embodiment, the counter can include a series of D-type flip-flops (e.g., a total of n flip-flops, such as shown by way of example in FIG. 9), preferably wherein each such flip-flop includes a D (data) input terminal, a CLK (clock) input terminal, a Q (normal) output terminal, and a Q (complementary) output terminal. In this example, the outputs of the flip-flops can be used directly as the $\alpha$ signals corresponding to clock signal rise and fall timing, such as wherein the reference clock signal is provided to each CLK input, each Q output is provided to the D input of the subsequent flip-flop (e.g., with the Q output from the final flip-flop wrapping back around to the D input of the zeroth flip-flop) and used as the $\alpha$ signal having the same index as the flip-flop from which it originated (e.g., wherein the flip-flops are indexed from 0 to n−1, wherein flip-flop 0 outputs the $\alpha_0$ signal, flip-flop 1 outputs the $\alpha_1$ signal, etc.), and each $\overline{Q}$ output is used as the $\alpha$ signal having the same index as the flip-flop from which it originated.

However, the system can additionally or alternatively include any other suitable counter and/or can provide the count in any other suitable manner.

The combinational logic networks preferably function to generate the multiplexer control signals (e.g., in examples in which the signals output by the counter are not used directly as multiplexer control signals). The combinational logic preferably uses the count signals (e.g., received from the counter) and/or other control signals (e.g., generated by the combinational logic of the controller) to generate the control signals. Additionally or alternatively, in some variations, the count signals may be suitable to directly control the multiplexer cells.

Figure 10A:
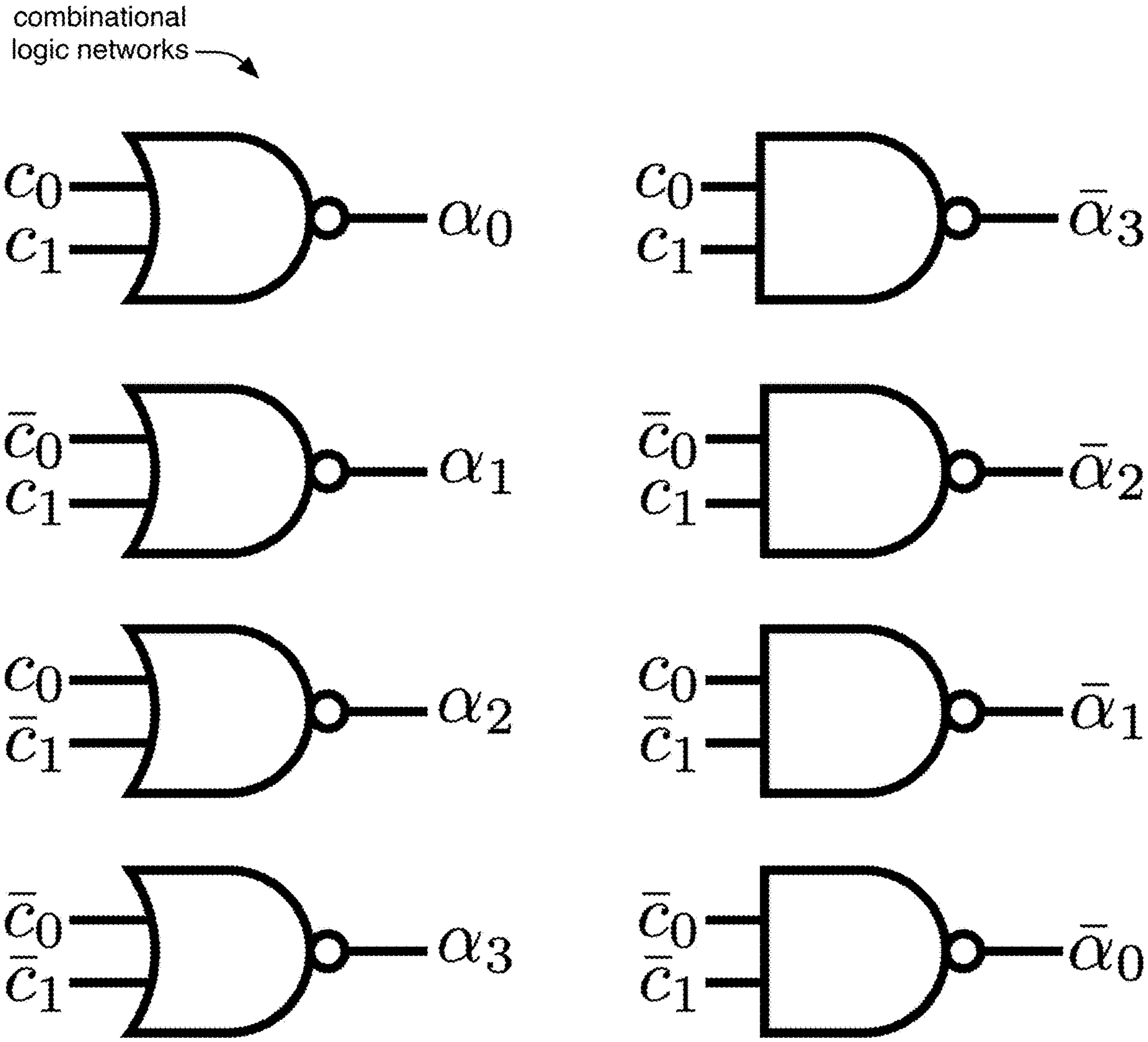
FIGS. 10A-10B are schematic representations of a first and second example, respectively, of combinational logic networks.
Figure 10B:
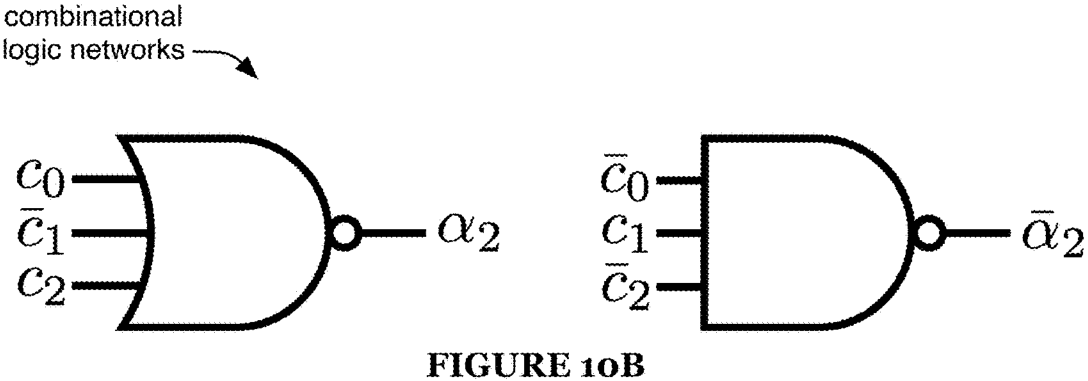

In a first example, in which the counter provides a b-bit binary count signal (e.g., where $n=2^b$), the controller can include one or more NOR and/or NAND gates (e.g., each accepting b inputs) to generate each a signal from the count signals. In this example, to generate a positive $\alpha_i$ signal, a NOR gate is preferably used, wherein for each bit in the binary representation of i, the positive value of the bit is used as input if the corresponding value in the binary representation is zero, and the inverse value of the bit is used if the corresponding value in the binary representation is one. Similarly, to generate the inverse $\alpha_i$ signal (represented as $\overline{\alpha}_i$), a NAND gate is preferably used, wherein for each bit in the binary representation of i, the inverse value of that bit is used if the corresponding value of that bit in the binary representation of i is zero, and the positive value of that bit is used as input if the corresponding value of that bit in the binary representation is one. A first specific example of these combinational logic networks for generating the $\alpha$ signals, in which n=4 (and so b=2), is shown in FIG. 10A. In a second specific example, in which n=8 (and so b=3), to generate the positive $\alpha_2$ signal, where i=2=0b010, a NOR gate accepts the positive $c_0$ bit, the inverse $c_1$ bit (represented as $\overline{c}_1$), and the positive $c_2$ bit, and to generate the $\overline{\alpha}_2$ signal, the inputs to a NAND gate are preferably $\overline{c}_0$, $c_1$, and $\overline{c}_2$ (e.g., as shown in FIG. 10B).

Figure 11A:
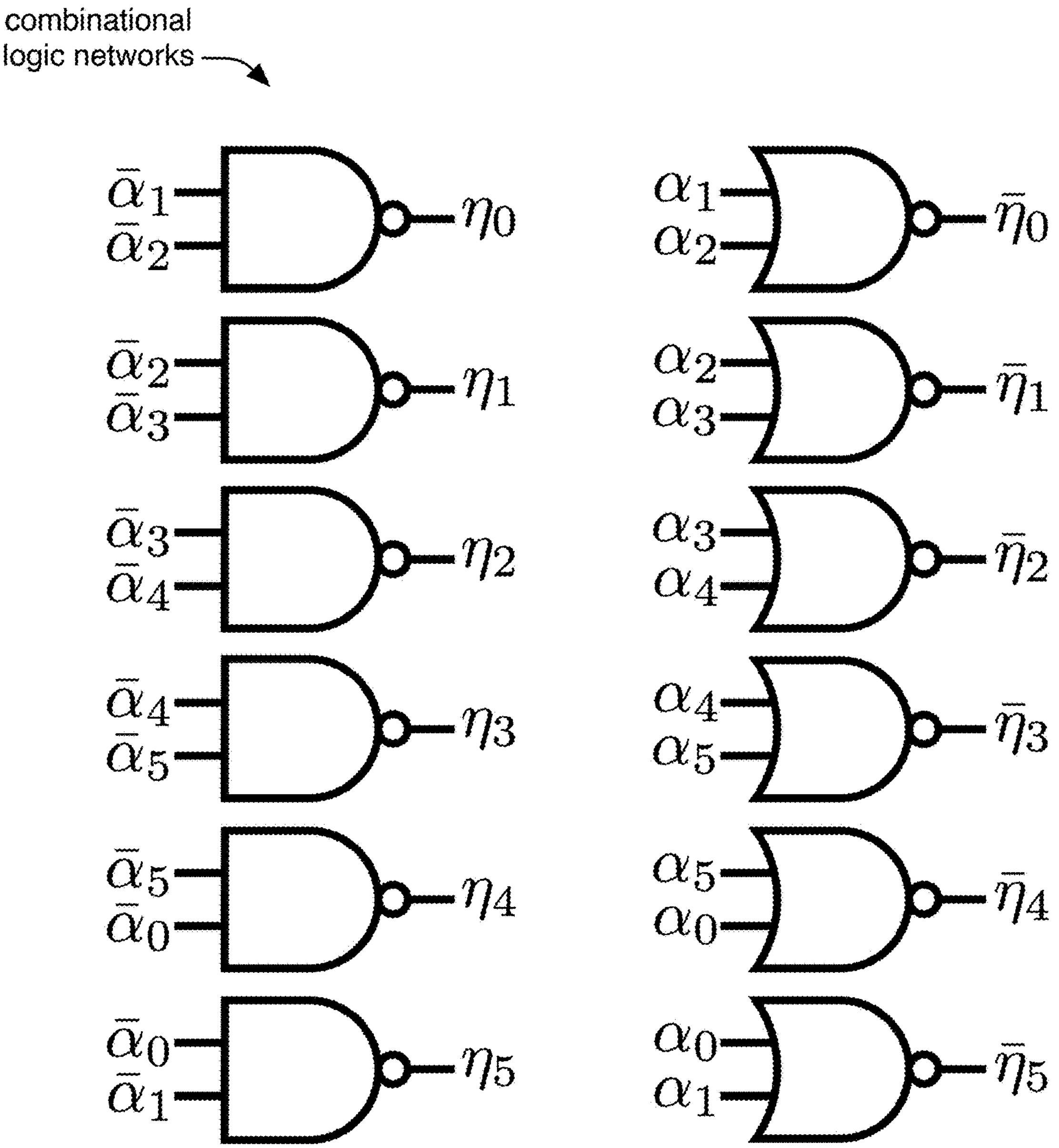
FIGS. 11A-11B are schematic representations of a third and fourth example, respectively, of combinational logic networks.
Figure 11B:
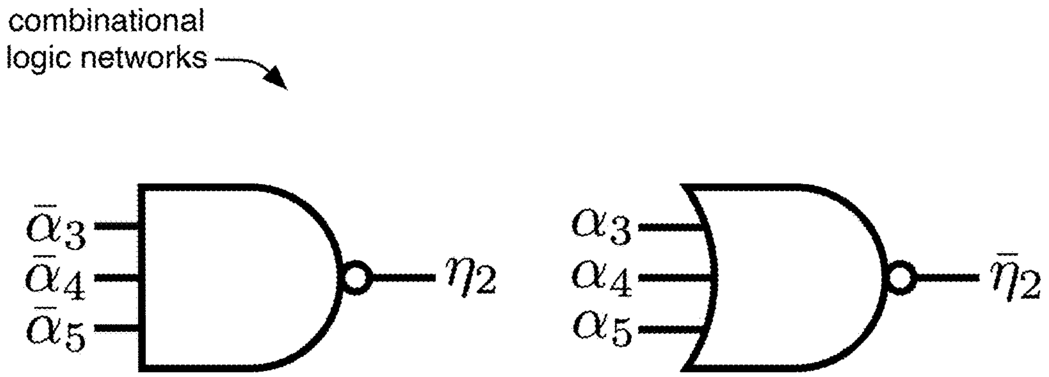

In a second example, in which $\eta$ signals (e.g., indicating the timing of flat, high, and/or low portions of each clock signal) are used, the n signals are preferably generated based on the $\alpha$ signals. In a first specific example, in which each flat region of a clock signal has a duration of two ticks, the $\eta_i$ signals are preferably generated as $\eta_i=\overline{\alpha}_{i+1}$ NAND $\overline{\alpha}_{i+2}$ and $\overline{\eta}_i=\alpha_{i+1}$ NOR $\alpha_{i+2}$ signals (e.g., as shown in FIG. 11A). For flat regions of longer duration, an additional $\alpha$ signal (e.g., $\alpha_{i+3}$, etc.) can be added for each additional tick of duration in an analogous manner (e.g., as shown in FIG. 11B). For flat regions having a single-tick duration, a single a signal can be used without modification (e.g., $\eta_i=\alpha_{i+1}$), and so no combinational logic is needed to generate $\eta$ signals having a single-tick duration. Similarly, in examples in which the clock signals are left floating during their flat regions (e.g., rather than being held statically by connection to a rail, such as a ground rail or high rail), the multiplexer may not require any n signals (e.g., wherein waveform construction relies only on the $\alpha$ signals), and so no combinational logic may be needed to generate n signals.

In a third example, for generating clock signals wherein any single clock signal uses only one inverter node for both the rise and fall portions of the signal, the controller preferably includes combinational logic to generate a set of $\beta$ signals based on the $\alpha$ signals. In a specific example, $$\beta_i = \alpha_i \vee \alpha_{i+\frac{n}{2}};$$

accordingly, the $\beta_i$ signals can be generated as $$\beta_i = \overline{\alpha}_i NAND \overline{\alpha}_{i+\frac{n}{2}}$$

and $$\overline{\beta}_i = \alpha_i NOR \alpha_{i+\frac{n}{2}}.$$

However, the controller can additionally or alternatively include any other suitable combinational logic having any suitable functionality (or can alternatively include no such combinational logic).

In some examples, the controller can optionally include one or more inverters. For example, each control signal (or any suitable subset of the control signals) can optionally be provided to an inverter. Each such inverter preferably has a high output impedance (e.g., to enable driving the switches of the multiplexer cells, which may represent a significant load). Additionally or alternatively, one or more buffers (e.g., high output impedance buffers) can be used in an analogous manner, and/or the controller can omit any such inverters and/or buffers.

However, the controller can additionally or alternatively include any other suitable elements in any suitable arrangement.

2.3 Multiplexer Cell.

Each multiplexer cell preferably functions to generate a plurality of clock signals (e.g., n distinct clock signals, such as trapezoidal and/or quasi-trapezoidal clock signals), such as shown by way of examples in FIGS. 14A, 14B, 15A, 15B, 15C, 15D, 16A, and 16B. Each multiplexer cell preferably includes a resonator and a plurality of timing switches, and can optionally include one or more supplementary switches and/or any other suitable elements. Each multiplexer cell of the system is preferably substantially identical, and each multiplexer cell of the system is preferably configured to generate substantially the same clock signals as the other multiplexer cells. However, the multiplexer cells can alternatively differ in design and/or configuration in any suitable manner.

In some examples, each multiplexer cell can be connected to a different region of a reversible computing system (e.g., connected to, and preferably co-located with, a different reversible computing pipeline or portion of a reversible computing pipeline). However, the multiplexer cells can additionally or alternatively have any other suitable connectivity. Further, in some examples, the system may include only a single multiplexer cell.

Figure 12:
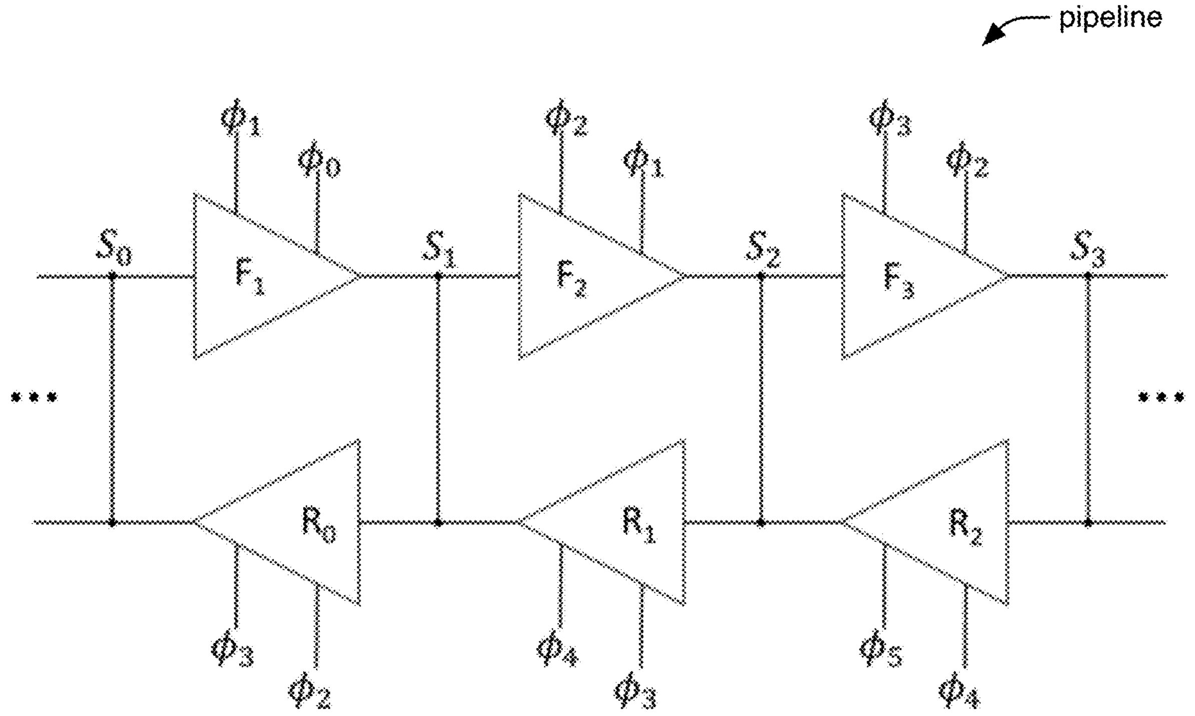
FIG. 12 is a schematic representation of an example of a reversible computing pipeline.
Figure 13:
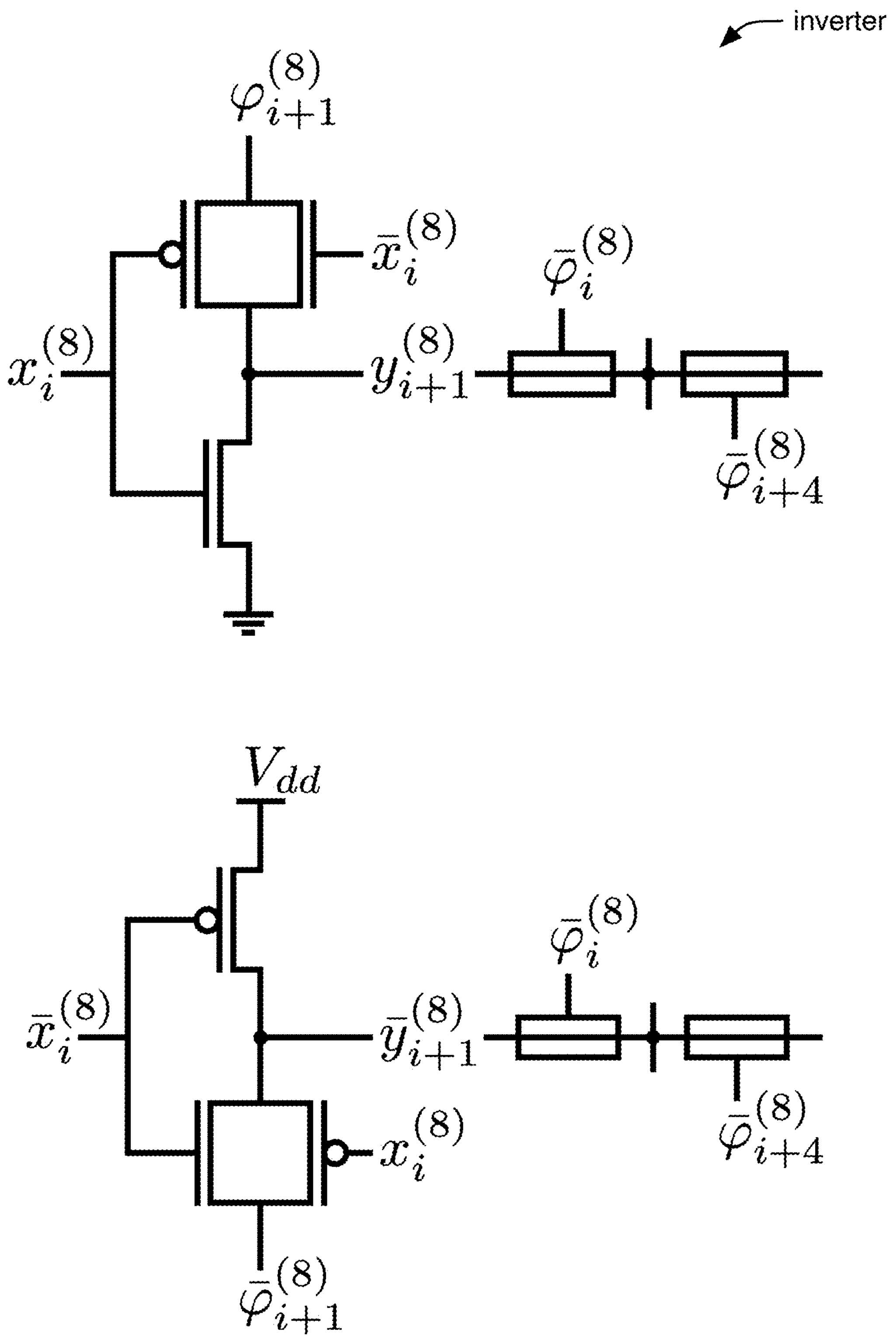
FIG. 13 is a schematic representation of an example of inverter networks of a reversible computing system.
Figure 14A:
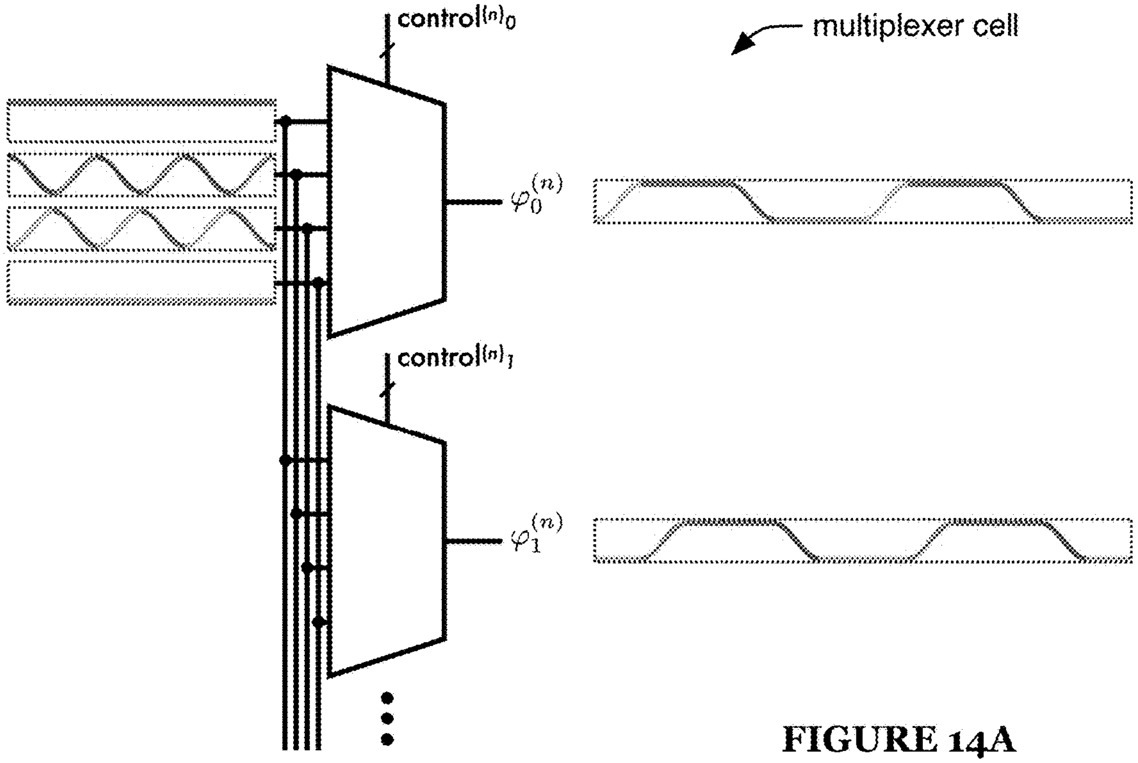
FIGS. 14A-14B are schematic representations of a first and second example, respectively, of a multiplexer cell.
Figure 14B:
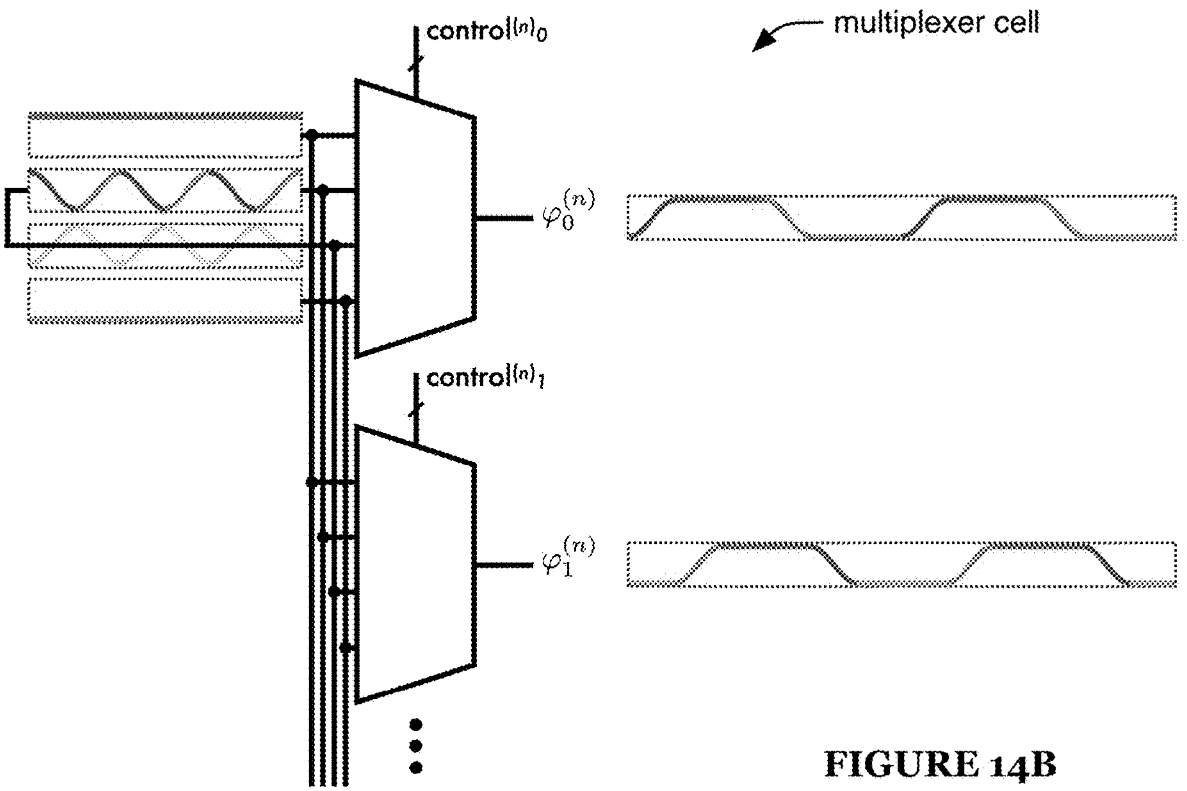

The multiplexer cell preferably defines a plurality of clock nodes. Each clock node is preferably configured to output a different clock signal generated by the system. Each clock node is preferably coupled to a different capacitive load, wherein the capacitive loads coupled to a multiplexer cell are preferably substantially equal to each other. In some examples, each clock node can be coupled to a different stage (or set of stages) of a reversible computing pipeline. In one such example, (e.g., as shown in FIG. 12), the reversible computing pipeline is an 8-phase S2LAL pipeline such as described in Frank, Michael P., et al. Reversible Computing with Fast, Fully Static, Fully Adiabatic CMOS. 2, arXiv: 2009.00448, arXiv, 2 Sep. 2020. arXiv.org, https://doi.org/10.48550/arXiv.2009.00448, which is herein incorporated in its entirety by this reference; a specific example of clock nodes connected to inverter networks of such an S2LAL pipeline is depicted in FIG. 13. Further, the multiplexer cell can include a plurality of clock networks, wherein each such clock network includes a single clock node, along with each timing switch connected to the clock node of the clock network. For example, a first clock network can include a first clock node, along with: a first timing switch that controls electrical connection between the first clock node and a first terminal (e.g., first side) of the resonator; a second timing switch that controls electrical connection between the first clock node and a second terminal (e.g., second side opposing the first side) of the resonator; a third timing switch that controls electrical connection between the first clock node and a first potential source (e.g., ground rail); and/or a fourth timing switch that controls electrical connection between the first clock node and a second potential source different (e.g., high rail) from the first potential source. In a first specific example, the first clock network includes the first clock node, the first timing switch, and the second timing switch. In a second specific example, the first clock network includes the first clock node, the first timing switch, the second timing switch, the third timing switch, and the fourth timing switch (e.g., wherein the third and fourth timing switches are each SPST switches; wherein the third and fourth timing switches are combined into a single SPDT switch; wherein the third and fourth timing switches are combined, along with switches of a second clock network, into a single DPDT switch; etc.). However, the clock nodes can additionally or alternatively have any other suitable connectivity.

The resonator preferably functions to provide a ramp signal (e.g., sinusoidal waveform, triangular waveform, etc.). The resonator preferably defines two nodes (e.g., wherein the nodes oppose each other across the resonator). Accordingly, signals (e.g., sinusoidal waveforms) 180° out of phase with each other can be obtained at the two resonator nodes. Additionally or alternatively, the multiplexer cell can include two or more resonators, wherein each such resonator defines one or more nodes at which the ramp signal (e.g., sinusoidal waveform) can be obtained (e.g., wherein two such nodes provide the ramp signal 180° out of phase with each other).

The resonator is preferably driven by a reference clock (e.g., wherein the resonator is (frequency- and) phase-matched to the reference clock). For example, the resonator can include a phase-matched oscillator in parallel with an inductor (e.g., as shown by way of examples in FIGS. 15A-15B). Alternatively, the resonator can be undriven, such as relying on an appropriate LC time constant to maintain the desired timing (e.g., as shown by way of examples in FIGS. 15C-15D).

The multiplexer cell is preferably configured to provide (e.g., selectively provide) one or more supplementary electrical connections to the resonator. For example, the multiplexer cell can include one or more supplementary switches (e.g., distinct from the plurality of timing switches described below), each configured to controllably connect one or more resonator nodes to external power sources (e.g., the high and/or ground rails); the multiplexer cell can change such external connections in phase with the resonator (e.g., based on the reference clock signal, based on the resonator output, etc.). Such connections can function as supplementary current sources (e.g., to pump the resonator) and/or voltage controls (e.g., pulling the resonator node to high or low, as appropriate). In a specific example, the multiplexer cell includes two single-pole double-throw (SPDT) switches: a first SPDT switch connected to a first resonator node (e.g., positive node) and a second SPDT switch connected to the opposing resonator node (e.g., negative node), wherein each SPDT switch can be connected to either the high rail or the ground rail (e.g., wherein one SPDT switch connects to the high rail while the other connects to the ground rail), such as shown by way of example in FIG. 15C. Additionally or alternatively, some or all of the timing switches responsible for holding the clock nodes at high or low potential, such as by connecting the clock node to the high rail or ground rail, can also function to provide external power to the resonator (e.g., as described below in more detail).

However, the multiplexer cell can additionally or alternatively include any other suitable resonators.

The plurality of timing switches preferably function to control connections from the voltage sources (e.g., ground rail, high rail, and/or resonator nodes) to the clock nodes. The switches are preferably configured to open and/or close based on control signals (e.g., received from the controller). The switches preferably couple each clock node to the appropriate resonator node during the time when the clock signal is ramping up or down. While the clock signal is not ramping, it is preferably held statically (e.g., coupled by the switches to either the ground rail or the high rail), but can alternatively be left floating (e.g., if dissipation from the clock node and elements connected thereto is sufficiently low).

Figure 15A:
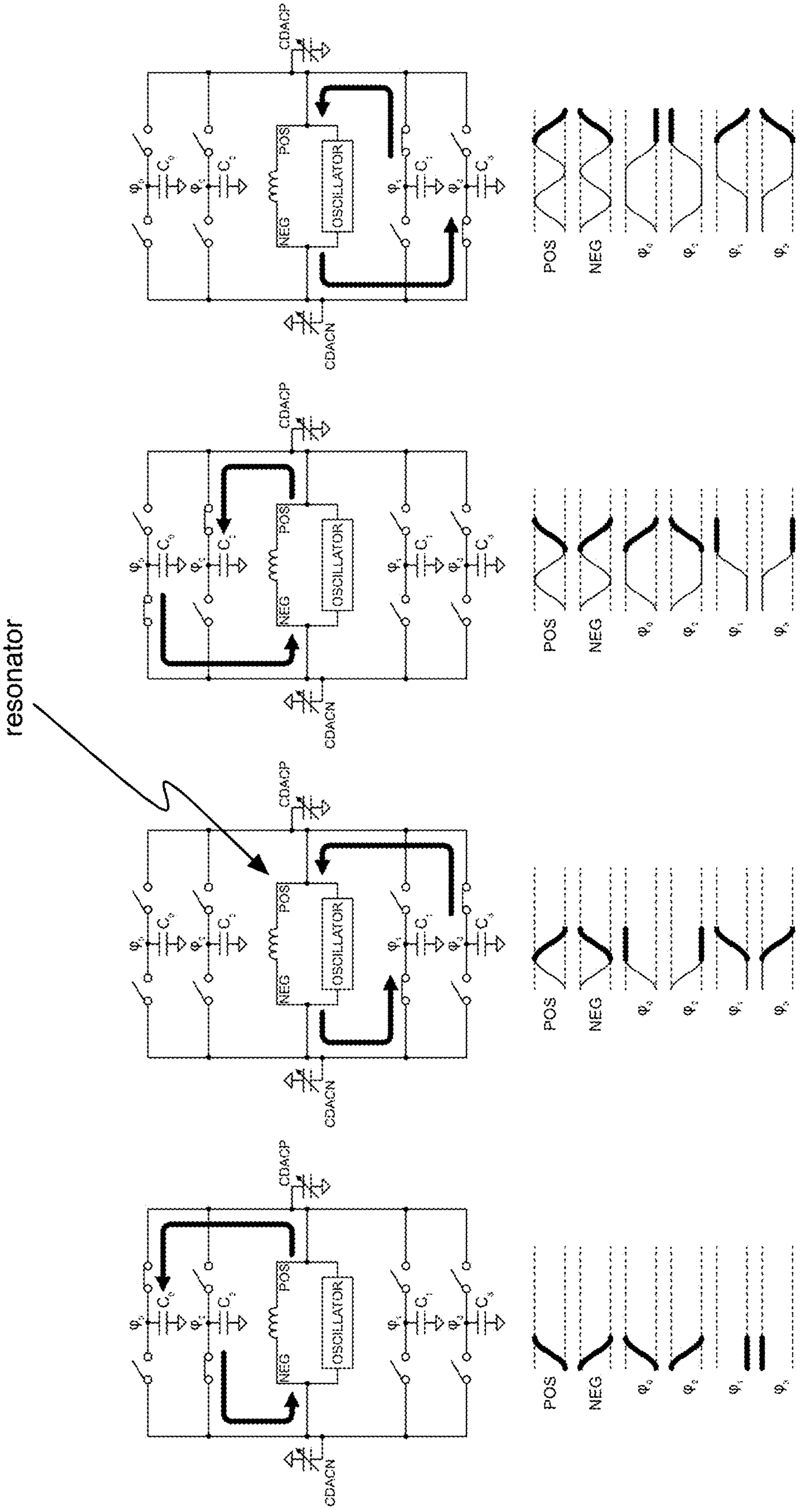
FIGS. 15A-15D are schematic representations of various examples of a multiplexer cell.

In a first specific example (e.g., as shown in FIG. 15A), each switch is (or includes) a T-gate. Each T-gate preferably includes an n-type switch connected in parallel with a p-type switch, wherein both switches are preferably controlled by the same logical value (e.g., accordingly, the n-type switch of a T-gate is preferably controlled by a positive control signal, and the p-type switch is preferably controlled by the corresponding inverse control signal).

Figure 15B:
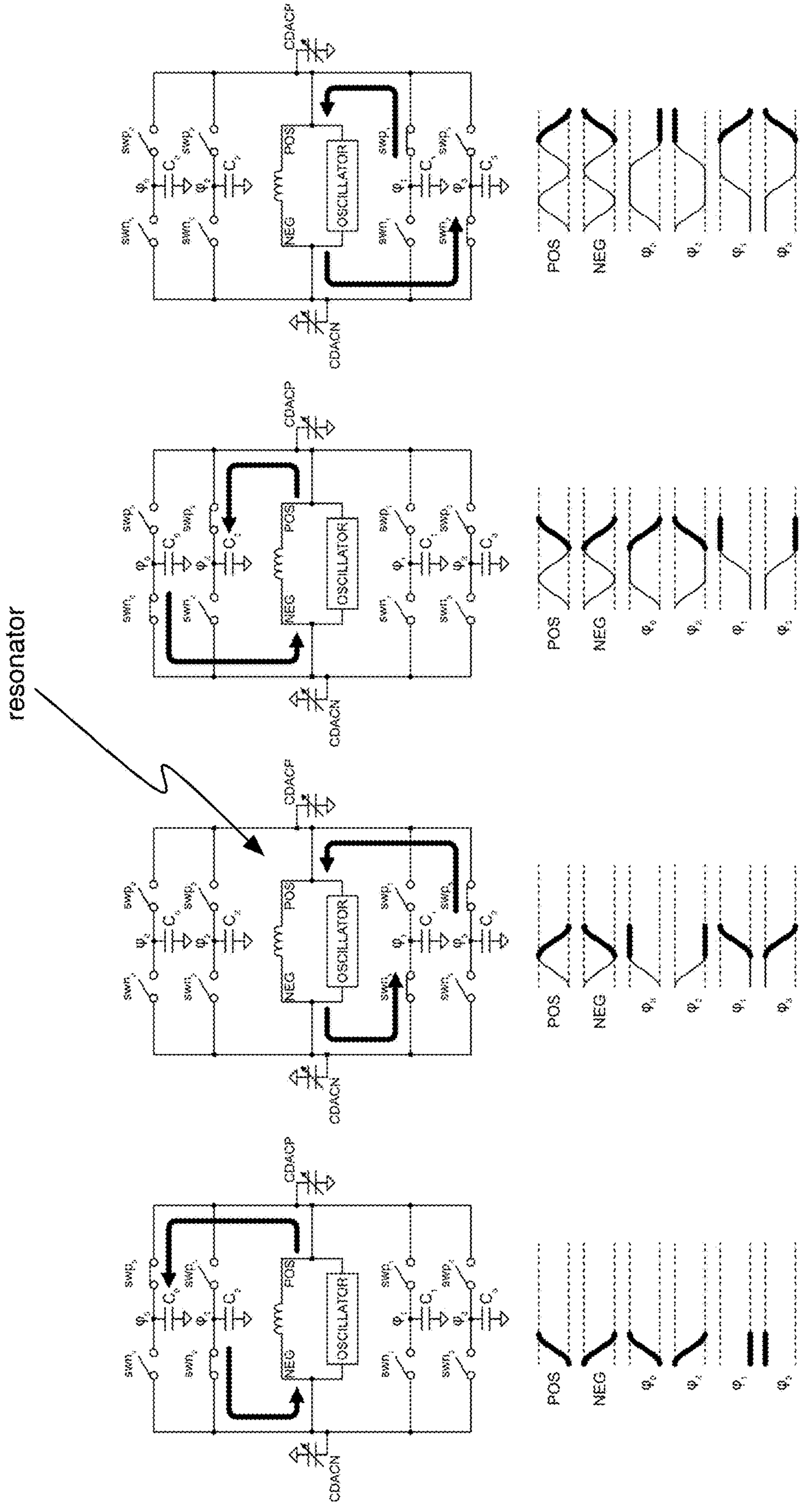

In a second specific example (e.g., as shown in FIG. 15B), the switches can include one or more n-type switches, p-type switches, and/or T-gates. Each n-type switch (e.g., n-type FET, such as an nFET or nMOS) is preferably operable to become conductive in response to a high control input (e.g., and accordingly, is preferably controlled by a positive control signal), and is preferably used to connect a clock signal to the ground rail. Each p-type switch (e.g., p-type FET, such as a pFET or pMOS) is preferably operable to become conductive in response to a low control input (e.g., and accordingly, is preferably controlled by an inverse control signal), and is preferably used to connect a clock signal to the high rail. Each T-gate preferably includes an n-type switch connected in parallel with a p-type switch, wherein both switches are preferably controlled by the same logical value (e.g., accordingly, the n-type switch of a T-gate is preferably controlled by a positive control signal, and the p-type switch is preferably controlled by the corresponding inverse control signal), and is preferably used to connect a clock signal to a resonator node (e.g., wherein a T-gate is used, rather than a single n-type or p-type switch alone, as the resonator node may take on any suitable voltage levels between those of the rails).

However, the multiplexer cell can additionally or alternatively include any other suitable switches having any suitable functionality.

Figure 16A:
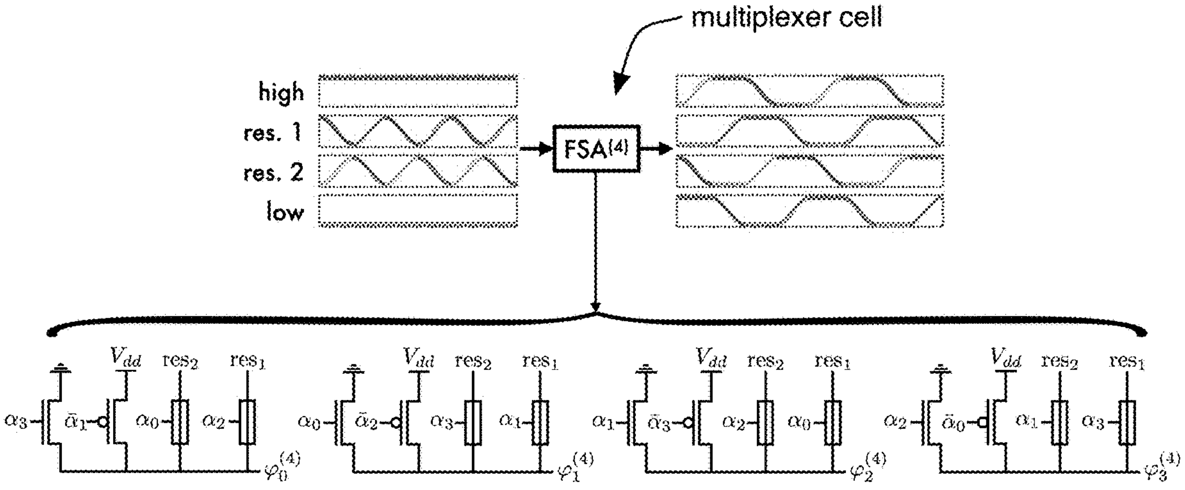
FIGS. 16A-16B are schematic representations of a third and fourth example, respectively, of a multiplexer cell.

In a first example, in which the system is configured to generate four clock signals, each defining an identical waveform having a one tick ramp up, followed by one tick high, followed by a one tick ramp down, followed by one tick low, and so on, the multiplexer cell can generate the four clock signals such as shown by way of example in FIG. 16A. Here, the two resonator nodes (labeled $res_1$ and $res_2$) provide sinusoidal (or analogously, triangular) waveforms 180° out of phase from each other (e.g., wherein the two resonator nodes correspond to two ends of a single resonator, two separate resonators, and/or any other suitable structures). Here, each clock node is coupled to the four voltage sources by switches of the plurality; in an analogous variation of this example, each clock node is coupled only to the resonator nodes by switches of the plurality, and is left floating during flat portions of its clock signal.

Figure 15C:
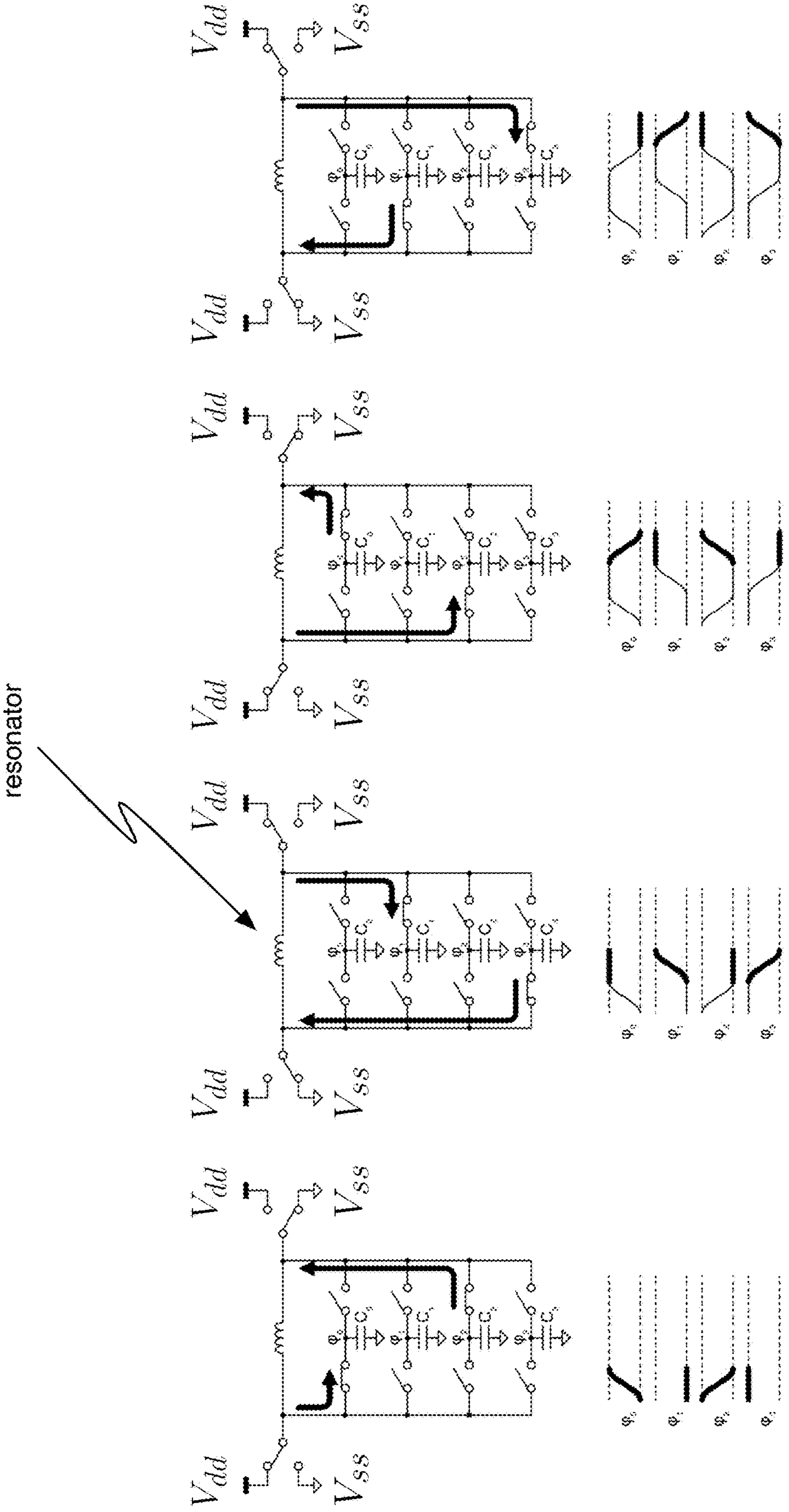

In a first specific example of this example (e.g., as shown in FIG. 15C), in which the clock nodes are left floating during the flat intervals of their corresponding clock signal, the multiplexer cell can include a resonator connected in parallel to four sets of switches, each controlling connection from a respective clock node to the two nodes of the resonator. Further, this specific example can optionally include switches configured to controllably connect the two resonator nodes to the high and ground rails (e.g., wherein one node connects to the high rail while the other connects to the ground rail), such as to provide additional energy to the cell (e.g., to compensate for dissipation). Here, the sets of switches open and close based on the control signals, thereby generating the desired clock signals.

Figure 15D:
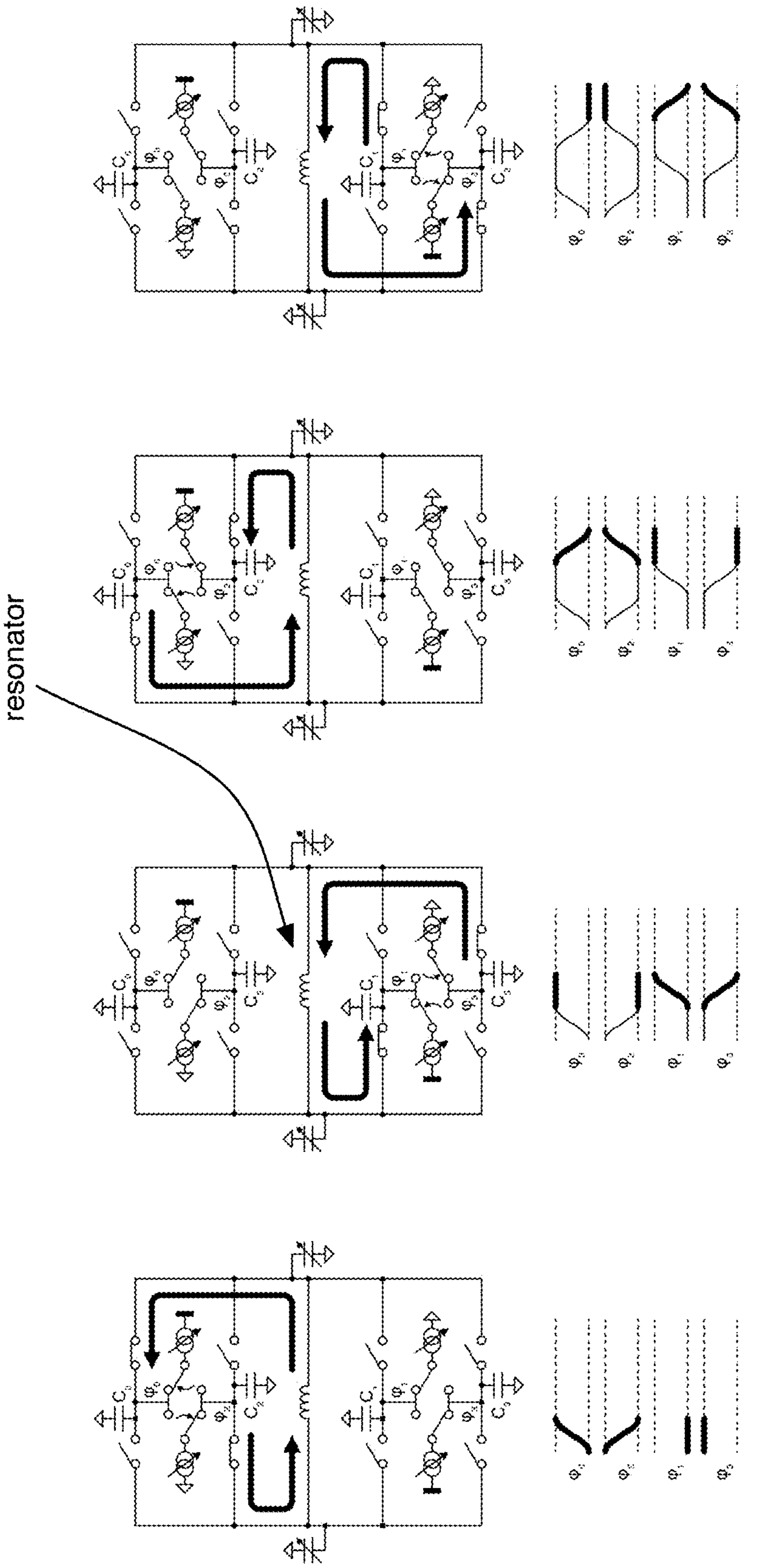

In a second specific example of this example, in which the clock nodes are held statically at all times, the multiplexer cell can additionally include one or more timing switches configured to couple the clock nodes to the high and ground rails (or any other suitable high-potential or low-potential voltage source), such as via a current source (e.g., voltage-limited constant or substantially-constant current source, wherein the current source supplies a substantially constant current up to (or up until close to) the voltage limit set by the potential source, such as the rail, to which it is connected, but does not cause the potential at the clock node to overshoot past the voltage limit) electrically connected between the clock node (e.g., via a timing switch) and a high-potential or low-potential rail (e.g., wherein the clock node can be connected by one timing switch to a high-potential current source tied to the high rail or connected by another timing switch to a ground-potential current source tied to the ground rail) at the appropriate times (e.g., based on the control signals provided by the controller), such as shown by way of example in FIG. 15D. Further, in some examples, such timing switches can optionally function to provide power to the resonator (and/or to any other suitable elements of the multiplexer cell). For example, during a tick in which a clock node is rising or falling (e.g., and thus is electrically connected to the resonator by a first timing switch), a second timing switch can also connect the high or ground rail to the resonator (e.g., via the first timing switch); during the subsequent tick, the second timing switch can stay in the same position, thereby holding the clock node at either high or ground, while the first timing switch is opened, disconnecting the clock node (and the second timing switch) from the resonator; after that, another timing switch can be used to connect the resonator to the other rail, and so on. In some such examples, pairs of such timing switches may always operate simultaneously with each other, and so each such pair could be implemented as one double pole double throw (DPDT) switch (e.g., wherein, in a first position, the switch connects a first clock node to ground and a second clock node to high, whereas in a second position, the switch connects the first clock node to high and the second clock node to ground); alternatively, each such pair could be implemented as a pair of SPDT switches (e.g., a first SPDT switch that connects ground to either the first or second clock node, and a second SPDT switch that connects high to either the first or second clock node; a first SPDT switch that connects the first clock node to either high or ground, and a second SPDT switch that connects the second clock node to either high or ground; etc.), four SPST switches (e.g., controlling connection between the first clock node and high, the first clock node and ground, the second clock node and high, and the second clock node and ground, respectively), and/or any other suitable switches of any kinds and/or connectivities.

In a particular example (e.g., as depicted in FIG. 15D), during a first tick, the zeroth clock node is rising, connected to a first side of the resonator by a first timing switch, and connected to the high rail by a second timing switch; meanwhile, the second clock node is falling, connected to a second side of the resonator (opposing the first side across the resonator) by a third timing switch, and connected to the ground rail by a fourth timing switch; accordingly, the high and ground rails can provide power to the resonator during this tick. During a second tick following the first tick, the first timing switch opens while the second timing switch remains unchanged, and so the zeroth clock node is held at high by its connection to the high rail via the second timing switch; meanwhile, the third timing switch opens while the fourth timing switch remains unchanged, and so the second clock node is held at ground by its connection to the ground rail via the fourth timing switch. During a third tick following the second tick, the zeroth clock node is connected to the second side of the resonator by a fifth timing switch, the second clock node is connected to the first side of the resonator by a sixth timing switch, and the second and fourth timing switches change position such that the first timing switch connects the high rail to the second clock node, and the fourth timing switch connects the ground rail to the zeroth clock node (accordingly, the high and ground rails can again provide power to the resonator during this tick via the zeroth and second clock nodes). During a fourth tick following the third tick, the fifth timing switch opens while the second timing switch remains unchanged, and so the zeroth clock node is held at ground by its connection to the ground rail via the second timing switch; meanwhile, the sixth timing switch opens while the fourth timing switch remains unchanged, and so the second clock node is held at high by its connection to the high rail via the fourth timing switch. Note that, during the second tick, the first clock node is rising and the third clock node is falling, wherein connections between the first and third clock nodes and the resonator are analogous to those described above regarding the zeroth and second clock nodes during the first tick (and accordingly, the high and ground rails can provide power to the resonator during this tick, but via the first and third clock nodes, rather than via the zeroth and second clock nodes). Analogously, during the fourth tick, the first clock node is falling and the third clock node is rising, wherein connections between the first and third clock nodes and the resonator are analogous to those described above regarding the zeroth and second clock nodes during the third tick (and accordingly, the high and ground rails can again provide power to the resonator during this tick via the first and third clock nodes).

In a variation of this second specific example, the timing switches are configured to connect the clock nodes directly to the high and ground rails (or any other suitable high-potential or low-potential voltage source) at the appropriate times (e.g., based on the control signals provided by the controller), with no current sources between the clock node and the rail to which it is connected. In this variation, these timing switches preferably do not connect a clock node to any constant-potential rail during a tick in which the clock node is ramping (e.g., rising from low to high or falling from high to low), but rather are connected only during a tick in which the clock node is held at constant potential (e.g., potential equal or substantially equal to the rail potential to which the clock node is connected). Accordingly, these timing switches typically will not function to provide significant (or any) power to the resonator, and it may be preferable to power the resonator in an alternate way (e.g., via supplementary switches such as described above and/or such as depicted by way of example in FIG. 15C).

Figure 16B:
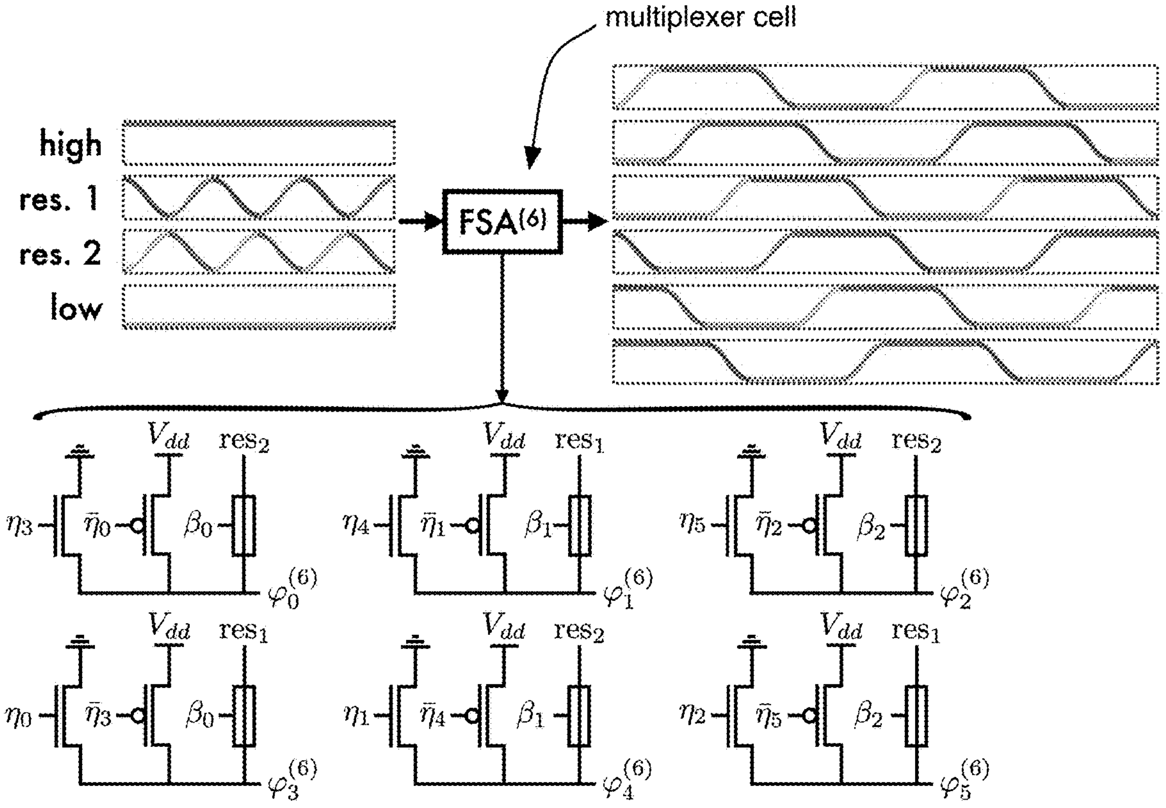

In a second example, in which the system is configured to generate six clock signals, each defining an identical waveform having a one tick ramp up, followed by two ticks high, followed by a one tick ramp down, followed by two ticks low, and so on, the multiplexer cell can generate the six clock signals such as shown by way of example in FIG. 16B. Here, the two resonator nodes (labeled $res_1$ and $res_2$) provide sinusoidal (or analogously, triangular) waveforms 180° out of phase from each other (e.g., wherein the two resonator nodes correspond to two ends of a single resonator, two separate resonators, and/or any other suitable structures). Here, each clock node is coupled to the four voltage sources by switches of the plurality; in an analogous variation of this example, each clock node is coupled only to the resonator nodes by switches of the plurality, and is left floating during flat portions of its clock signal. In this example, $\eta$ signals are used to control connections to the rails, while $\beta$ signals are used to control connections to the resonator nodes (e.g., as discussed above in more detail regarding the $\eta$ and $\beta$ signals).

In a manner analogous to that described above regarding specific examples of the first example, specific examples can be constructed corresponding to the second example and/or to examples generating any other suitable number of clock signals.

In some examples, the multiplexer cell can include one or more adjustment networks, which can function to compensate (and/or enable compensation) for variations such as process variations (e.g., in multiplexer cell fabrication) and/or temperature variations (e.g., leading to frequency drift, circuit asymmetries, etc.). For example, the multiplexer cell can include two adjustment networks (e.g., a first on the positive side of the cell, and a second on the negative side of the cell), which can function to enable symmetry maintenance between the positive and negative sides and/or to enable independent tuning of each side separately. The adjustment networks preferably include capacitive adjustment networks, such as capacitive digital adjustment components (CDACs). For example, each CDAC (e.g., a positive CDAC (CDACP) on the positive side of the cell and a negative CDAC (CDACN) on the negative side of the cell) can include a variable capacitor (e.g., voltage-controlled capacitor, such as a varactor diode; digitally tuned capacitor; etc.), preferably connected between the multiplexer cell and ground (e.g., as shown in FIGS. 15A, 15B, and/or 15D). The variable capacitor preferably receives a control signal (e.g., DC bias voltage) operable to control the variable capacitor to alter its capacitance, but can additionally or alternatively be operable to vary its capacitance in any other suitable manner. However, the adjustment networks can additionally or alternatively include one or more networks that are additionally or alternatively operable and/or configured to adjust any other suitable characteristics of the cell.

However, the multiplexer cell can additionally or alternatively include any other suitable elements in any suitable arrangement.

Further, the multiplexed clock system can additionally or alternatively include any other suitable elements in any suitable arrangement.

3. Method.

The method preferably includes generating a plurality of clock signals and/or providing clock signals to a computing system.

The clock signals are preferably trapezoidal and/or quasi-trapezoidal (but can alternatively have any other suitable characteristics). During any given tick, an equal number of clock signals are preferably ramping up and ramping down (wherein the remaining clock signals are preferably held substantially constant); further, the number of clock signals ramping up (and down) is preferably equal between the different ticks defined by the set of clock signals.

In examples, the clock signals can include four-phase signals (e.g., as shown in FIGS. 3A-3B, six-phase signals (e.g., as shown in FIG. 3C), eight-phase signals (e.g., as shown in FIG. 3E), five-phase signals (e.g., as shown in FIG. 3D), Bennett clock signals (e.g., as shown in FIG. 4), and/or any other suitable clock signals.

However, the method can additionally or alternatively include generating any other suitable clock signals.

Providing clock signals to a computing system preferably includes providing the clock signals generated as described above. The computing system is preferably a reversible computing system, but can additionally or alternatively include any other suitable computing system. In examples, the reversible computing system can be a 2LAL system, S2LAL system (e.g., as described in Frank, Michael P., et al. Reversible Computing with Fast, Fully Static, Fully Adiabatic CMOS. 2, arXiv: 2009.00448, arXiv, 2 Sep. 2020. arXiv.org, https://doi.org/10.48550/arXiv.2009.00448, which is herein incorporated in its entirety by this reference), Q2LAL system, Bennet system, and/or any other suitable system. However, the method can additionally or alternatively include providing any suitable clock signals to any suitable computing system.

Further, the method can additionally or alternatively include any other suitable elements performed in any suitable manner.

All references cited herein are incorporated by reference in their entirety, except to the extent that the incorporated material is inconsistent with the express disclosure herein, in which case the language in this disclosure controls.

As used herein, "substantially" or other words of approximation can be within a predetermined error threshold or tolerance of a metric, component, or other reference, and/or be otherwise interpreted.

Optional elements, which can be included in some variants but not others, are indicated in broken line in the figures. However, unbroken lines in the figures should not be interpreted to indicate that the depicted elements are essential or may not be omitted from variants of the invention.

Different subsystems and/or modules discussed above can be operated and controlled by the same or different entities. In the latter variants, different subsystems can communicate via: APIs (e.g., using API requests and responses, API keys, etc.), requests, and/or other communication channels. Communications between systems can be encrypted (e.g., using symmetric or asymmetric keys), signed, and/or otherwise authenticated or authorized.

Alternative embodiments implement the above methods and/or processing modules in non-transitory computer-readable media, storing computer-readable instructions that, when executed by a processing system, cause the processing system to perform the method(s) discussed herein. The instructions can be executed by computer-executable components integrated with the computer-readable medium and/or processing system. The computer-readable medium may include any suitable computer readable media such as RAMs, ROMs, flash memory, EEPROMs, optical devices (CD or DVD), hard drives, floppy drives, non-transitory computer readable media, or any suitable device. The computer-executable component can include a computing system and/or processing system (e.g., including one or more collocated or distributed, remote or local processors) connected to the non-transitory computer-readable medium, such as CPUs, GPUs, TPUS, microprocessors, or ASICs, but the instructions can alternatively or additionally be executed by any suitable dedicated hardware device.

Embodiments of the system and/or method can include every combination and permutation of the various system components and the various method processes, wherein one or more instances of the method and/or processes described herein can be performed asynchronously (e.g., sequentially), contemporaneously (e.g., concurrently, in parallel, etc.), or in any other suitable order by and/or using one or more instances of the systems, elements, and/or entities described herein. Components and/or processes of the following system and/or method can be used with, in addition to, in lieu of, or otherwise integrated with all or a portion of the systems and/or methods disclosed in the applications mentioned above, each of which are incorporated in their entirety by this reference.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A multiplexed clock system comprising a multiplexer cell, the multiplexer cell comprising:
- a resonator defining:
  - a first terminal at which the resonator provides a first oscillating electrical signal; and
  - a second terminal at which the resonator provides a second oscillating electrical signal, wherein the second oscillating electrical signal is substantially identical to an inverse of the first oscillating electrical signal;
- a plurality of clock networks, wherein each clock network of the plurality defines a respective clock node, wherein each clock network of the plurality comprises:
  - a respective first timing switch operable between:
    - a closed state, in which the respective first timing switch electrically connects the respective clock node to the first terminal; and
    - an open state, in which the respective first timing switch does not electrically connect the respective clock node to the first terminal; and
  - a respective second timing switch operable between:
    - a closed state, in which the respective second timing switch electrically connects the respective clock node to the second terminal; and
    - an open state, in which the respective second timing switch does not electrically connect the respective clock node to the second terminal.

2. The system of claim 1, wherein each clock network of the plurality further comprises:
- a respective third timing switch operable between:
  - a first state, in which the respective third timing switch electrically couples the respective clock node to a low-potential voltage source; and
  - a second state, in which the respective third timing switch does not electrically couples the respective clock node to the low-potential voltage source; and
- a respective fourth timing switch operable between:
  - a first state, in which the respective fourth timing switch does not electrically couples the respective clock node to a high-potential source; and
  - a second state, in which the respective fourth timing switch electrically couples the respective clock node to the high-potential source.

3. The system of claim 2, further comprising a low-potential current source electrically connected to the low-potential voltage source and a high-potential current source electrically connected to the high-potential voltage source, wherein, for each clock network of the plurality, the respective third timing switch and the respective fourth timing switch cooperatively define a respective double-throw switch operable between:

a first state, in which the respective double-throw switch electrically couples the respective clock node to the low-potential voltage source via the low-potential current source; and a second state, in which the respective double-throw switch electrically connects the respective clock node to the high-potential voltage source via the high-potential current source.

4. The system of claim 1, wherein the oscillating electrical signal is substantially sinusoidal.

5. The system of claim 1, wherein the resonator comprises an inductor electrically coupling the first terminal to the second terminal, wherein the second terminal opposes the first terminal across the inductor.

6. The system of claim 5, wherein the resonator further comprises an oscillator electrically coupling the first terminal to the second terminal in parallel with the inductor, wherein the second terminal opposes the first terminal across the oscillator.

7. The system of claim 1, wherein the multiplexer cell further comprises:

a first supplementary switch operable between:

a high mode, in which the first supplementary switch electrically couples the first terminal to a high-potential source; and a low mode, in which the first supplementary switch electrically couples the first terminal to a low-potential source; and a second supplementary switch operable between:

a high mode, in which the second supplementary switch electrically couples the second terminal to a high-potential source; and a low mode, in which the second supplementary switch electrically couples the second terminal to a low-potential source.

8. The system of claim 1, wherein, for each clock network of the plurality, the respective clock node is capacitively coupled to a voltage source.

9. The system of claim 8, wherein the voltage source is a ground rail.

10. The system of claim 1, wherein:

the multiplexer cell defines a plurality of timing switches, the plurality of timing switches comprising the respective first timing switch and the respective second timing switch of each clock network of the plurality of clock networks;

the plurality of clock networks consists of n clock networks;

the system further comprises a controller that controls each timing switch of the plurality of timing switches, the controller comprising:

a counter that counts modulo n and provides an output signal indicative of the count; and a set of combinational logic networks, wherein each combinational logic network of the set:

receives a respective portion of the output signal from the counter;

generates a respective control signal based on the respective portion of the output signal; and controls at least one timing switch of the plurality of timing switches by providing the respective control signal to the at least one timing switch.

11. The system of claim 10, wherein:

the system further comprises a reference clock that provides a periodic control signal to the counter, the periodic control signal having a period defined as 1 tick;

the first oscillating electrical signal has a period of 2 ticks;

for each clock network of the plurality, the respective clock node is configured to output a respective periodic clock signal having a period of n ticks, the respective periodic clock signal different from the periodic clock signals of all other clock networks of the plurality; and the counter counts ticks modulo n, wherein the output signal is indicative of the tick count.

12. The system of claim 11, wherein:

n is equal to 4, wherein the plurality of clock networks consists of a first, second, third, and fourth clock network;

for the first clock network, the respective periodic clock signal is a first clock signal consisting essentially of: a first tick substantially rising from a low potential to a high potential, followed by a second tick substantially held at the high potential, followed by a third tick substantially falling from the high potential to the low potential, followed by a fourth tick substantially held at the low potential;

for the second clock network, the respective periodic clock signal is a second clock signal substantially equal to the first clock signal delayed in phase by one tick;

for the third clock network, the respective periodic clock signal is a third clock signal substantially equal to the first clock signal delayed in phase by two ticks; and for the fourth clock network, the respective periodic clock signal is a fourth clock signal substantially equal to the first clock signal delayed in phase by three ticks.

13. The system of claim 12, wherein:

during the first tick:

the first oscillating electrical signal rises from low potential to high potential;

the first timing switch of the first clock network is in the closed state;

the second timing switch of the first clock network is in the open state;

the first timing switch of the third clock network is in the open state;

the second timing switch of the third clock network is in the closed state; and the first and second timing switches of the second and fourth clock networks are in the open state;

during the second tick:

the first oscillating electrical signal falls from high potential to low potential;

the first timing switch of the fourth clock network is in the closed state;

the second timing switch of the fourth clock network is in the open state;

the first timing switch of the second clock network is in the open state;

the second timing switch of the second clock network is in the closed state; and the first and second timing switches of the first and third clock networks are in the open state;

during the third tick:

the first oscillating electrical signal rises from low potential to high potential;

the first timing switch of the first clock network is in the open state;

the second timing switch of the first clock network is in the closed state;

the first timing switch of the third clock network is in the closed state;

the second timing switch of the third clock network is in the open state; and the first and second timing switches of the second and fourth clock networks are in the open state; and during the fourth tick:

the first oscillating electrical signal falls from high potential to low potential;

the first timing switch of the fourth clock network is in the open state;

the second timing switch of the fourth clock network is in the closed state;

the first timing switch of the second clock network is in the closed state;

the second timing switch of the second clock network is in the open state; and the first and second timing switches of the first and third clock networks are in the open state.

14. The system of claim 13, wherein the plurality of timing switches further comprises:

a first double-pole double-throw (DPDT) switch operable between:

a first state, in which the first DPDT switch electrically connects the first clock node to a low-potential source and not to a high-potential source, and electrically connects the third clock node to the high-potential source and not to the low-potential source; and a second state, in which the first DPDT switch electrically connects the third clock node to a low-potential source and not to a high-potential source, and electrically connects the first clock node to the high-potential source and not to the low-potential source; and a second DPDT switch operable between:

a first state, in which the second DPDT switch electrically connects the second clock node to a low-potential source and not to a high-potential source, and electrically connects the fourth clock node to the high-potential source and not to the low-potential source; and a second state, in which the second DPDT switch electrically connects the fourth clock node to a low-potential source and not to a high-potential source, and electrically connects the second clock node to the high-potential source and not to the low-potential source;

wherein:

during the first and second ticks, the first DPDT switch operates in the second state;

during the third and fourth ticks, the first DPDT switch operates in the first state;

during the second and third ticks, the second DPDT switch operates in the second state; and during the fourth and first ticks, the second DPDT switch operates in the first state.

15. The system of claim 14, wherein the system is implemented as an integrated circuit, wherein each switch of the plurality of switches comprises one or more transistors of the integrated circuit.

16. A method for clock signal generation, the method comprising:

at a counter, generating a count signal indicative of a tick count modulo n, where n is a positive integer, wherein the tick count increments with substantially regular timing, wherein the time between tick count increments is defined as 1 tick;

at a resonator of a multiplexer cell, generating first oscillating electrical signal and a second oscillating electrical signal substantially identical to an inverse of the first oscillating electrical signal, wherein the first oscillating electrical signal is periodic with a period substantially equal to 2 ticks, wherein the multiplexer cell further comprises a set of timing switches and defines a plurality of clock nodes, wherein each clock node of the plurality is controllably coupled to the resonator via at least one timing switch of the set;

at a set of combinational logic networks:

receiving at least a portion of the count signal;

based on the count signal, generating a set of control signals, wherein the set of control signals changes each time the count signal changes; and controlling the multiplexer cell by providing the set of control signals to the set of timing switches;

at the set of timing switches, in response to receiving the set of control signals:

during a first tick:

electrically connecting a first clock node of the plurality to the first oscillating electrical signal and not to the second oscillating electrical signal; and electrically connecting a second clock node of the plurality to the second oscillating electrical signal and not to the first oscillating electrical signal; and during a later tick after the first tick:

electrically connecting the second clock node to the first oscillating electrical signal and not to the second oscillating electrical signal; and electrically connecting the first clock node to the second oscillating electrical signal and not to the first oscillating electrical signal.

17. The method of claim 16, wherein the first oscillating electrical signal is substantially sinusoidal.

18. The method of claim 16, wherein the plurality of clock nodes further comprises a third clock node and a fourth clock node, wherein n is equal to 4, wherein the later tick is a third tick, the method further comprising, at the set of timing switches, in response to receiving the set of control signals:

during a second tick between the first tick and the third tick:

electrically connecting the first oscillating electrical signal to the third clock node and not to the first, second, or fourth clock node; and electrically connecting the second oscillating electrical signal to the fourth clock node and not to the first, second, or third clock node; and during a fourth tick after the third tick:

electrically connecting the second oscillating electrical signal to the third clock node and not to the first, second, or fourth clock node; and electrically connecting the first oscillating electrical signal to the fourth clock node and not to the first, second, or third clock node.

19. The method of claim 18, further comprising, at the set of timing switches, in response to receiving the set of control signals:

during the first tick:

electrically connecting the third clock node to a low-potential source; and electrically connecting the fourth clock node to a high-potential source;

during the second tick:

electrically connecting the second clock node to the low-potential source; and electrically connecting the first clock node to the high-potential source;

during the third tick:

electrically connecting the fourth clock node to the low-potential source; and electrically connecting the third clock node to the high-potential source; and during the fourth tick:

electrically connecting the first clock node to the low-potential source; and electrically connecting the second clock node to the high-potential source.

20. The method of claim 19, further comprising, at the set of timing switches, in response to receiving the set of control signals:

during the first tick:

electrically connecting the second clock node to the low-potential source, such that the resonator is electrically connected to the low-potential source via the second clock node; and electrically connecting the first clock node to the high-potential source, such that the resonator is electrically connected to the high-potential source via the first clock node;

during the second tick:

electrically connecting the third clock node to the low-potential source, such that the resonator is electrically connected to the low-potential source via the third clock node; and electrically connecting the fourth clock node to the high-potential source, such that the resonator is electrically connected to the high-potential source via the fourth clock node;

during the third tick:

electrically connecting the first clock node to the low-potential source, such that the resonator is electrically connected to the low-potential source via the first clock node; and electrically connecting the second clock node to the high-potential source, such that the resonator is electrically connected to the high-potential source via the second clock node; and during the fourth tick:

electrically connecting the fourth clock node to the low-potential source, such that the resonator is electrically connected to the low-potential source via the fourth clock node; and electrically connecting the third clock node to the high-potential source, such that the resonator is electrically connected to the high-potential source via the third clock node.

* * * * *